(12) United States Patent
Kawahito

(10) Patent No.: US 10,680,032 B2
(45) Date of Patent: Jun. 9, 2020

(54) PHOTOELECTRIC CONVERSION ELEMENT AND SOLID-STATE IMAGE PICKUP DEVICE

(71) Applicant: National University Corporation Shizuoka University, Shizuoka-shi, Shizuoka (JP)

(72) Inventor: Shoji Kawahito, Hamamatsu (JP)

(73) Assignee: NATIONAL UNIVERSITY CORPORATION SHIZUOKA UNIVERSITY, Shizuoka-shi (JP)

( * ) Notice: Subject to any disclaimer, the term of this patent is extended or adjusted under 35 U.S.C. 154(b) by 0 days.

(21) Appl. No.: 16/331,544

(22) PCT Filed: Sep. 15, 2017

(86) PCT No.: PCT/JP2017/033599
§ 371 (c)(1),
(2) Date: Mar. 8, 2019

(87) PCT Pub. No.: WO2018/056232
PCT Pub. Date: Mar. 29, 2018

(65) Prior Publication Data
US 2019/0206922 A1 Jul. 4, 2019

(30) Foreign Application Priority Data
Sep. 21, 2016 (JP) .................. 2016-184681

(51) Int. Cl.
*H01L 27/146* (2006.01)
*H04N 5/378* (2011.01)
(Continued)

(52) U.S. Cl.
CPC .... *H01L 27/14643* (2013.01); *H01L 27/1461* (2013.01); *H01L 27/14607* (2013.01);
(Continued)

(58) Field of Classification Search
CPC .............. H04N 5/35581; H04N 5/3535; H01L 27/14643; H01L 27/1461; H01L 31/10; H01L 27/14607; H01L 27/14623
See application file for complete search history.

(56) References Cited

U.S. PATENT DOCUMENTS 8,338,248 B2   12/2012   Kawahito
9,231,006 B2   1/2016    Kawahito et al.
(Continued)

FOREIGN PATENT DOCUMENTS

JP   2006-246450 A   9/2006
JP   2010-278654 A   12/2010
(Continued)

*Primary Examiner* — Anthony Ho
(74) *Attorney, Agent, or Firm* — Metrolex IP Law Group, PLLC

(57) ABSTRACT

The present invention provides a photoelectric conversion element and a solid-state image sensor, having a simple structure, a wide dynamic range, a high speed and a high sensibility, which includes a principal layer of a first conductivity type, a surface-buried region of a second conductivity type, selectively buried in an upper portion of the principal layer so as to implements a photodiode with the principal layer, a first charge-accumulation region of the second conductivity type, buried in the upper portion of the principal layer configured to accumulate first signal charges transferred from the surface-buried region, generated by the photodiode, and a second charge-accumulation region of the second conductivity type, buried in the principal layer configured to accumulate second signal charges transferred from the surface-buried region, generated by the photodiode, wherein a process including a first period, in which the first signal charges are transferred from the surface-buried region to the first charge-accumulation region, and a second period shorter than the first period, in which the second signal charges are transferred from the surface-buried region to the
(Continued)

second charge-accumulation region is repeated multiple times in one frame period.

8 Claims, 15 Drawing Sheets

(51) Int. Cl.
    *H04N 5/355*     (2011.01)
    *H01L 31/10*     (2006.01)
    *H04N 5/3745*     (2011.01)
    *H04N 5/353*     (2011.01)

(52) U.S. Cl.
    CPC ........ *H01L 27/14612* (2013.01); *H01L 31/10* (2013.01); *H04N 5/355* (2013.01); *H04N 5/3535* (2013.01); *H04N 5/35581* (2013.01); *H04N 5/378* (2013.01); *H04N 5/37452* (2013.01); *H01L 27/14623* (2013.01)

(56) References Cited

U.S. PATENT DOCUMENTS

| | | |
|---|---|---|
| 2010/0187401 A1 | 7/2010 | Kawahito |
| 2011/0298079 A1 | 12/2011 | Kawahito |
| 2012/0193743 A1 | 8/2012 | Kawahito et al. |

FOREIGN PATENT DOCUMENTS

| | | |
|---|---|---|
| JP | 2014-160878 A | 9/2014 |
| WO | 2007/083704 A1 | 7/2007 |
| WO | 2010/074252 A1 | 7/2010 |
| WO | 2011/043339 A1 | 4/2011 |

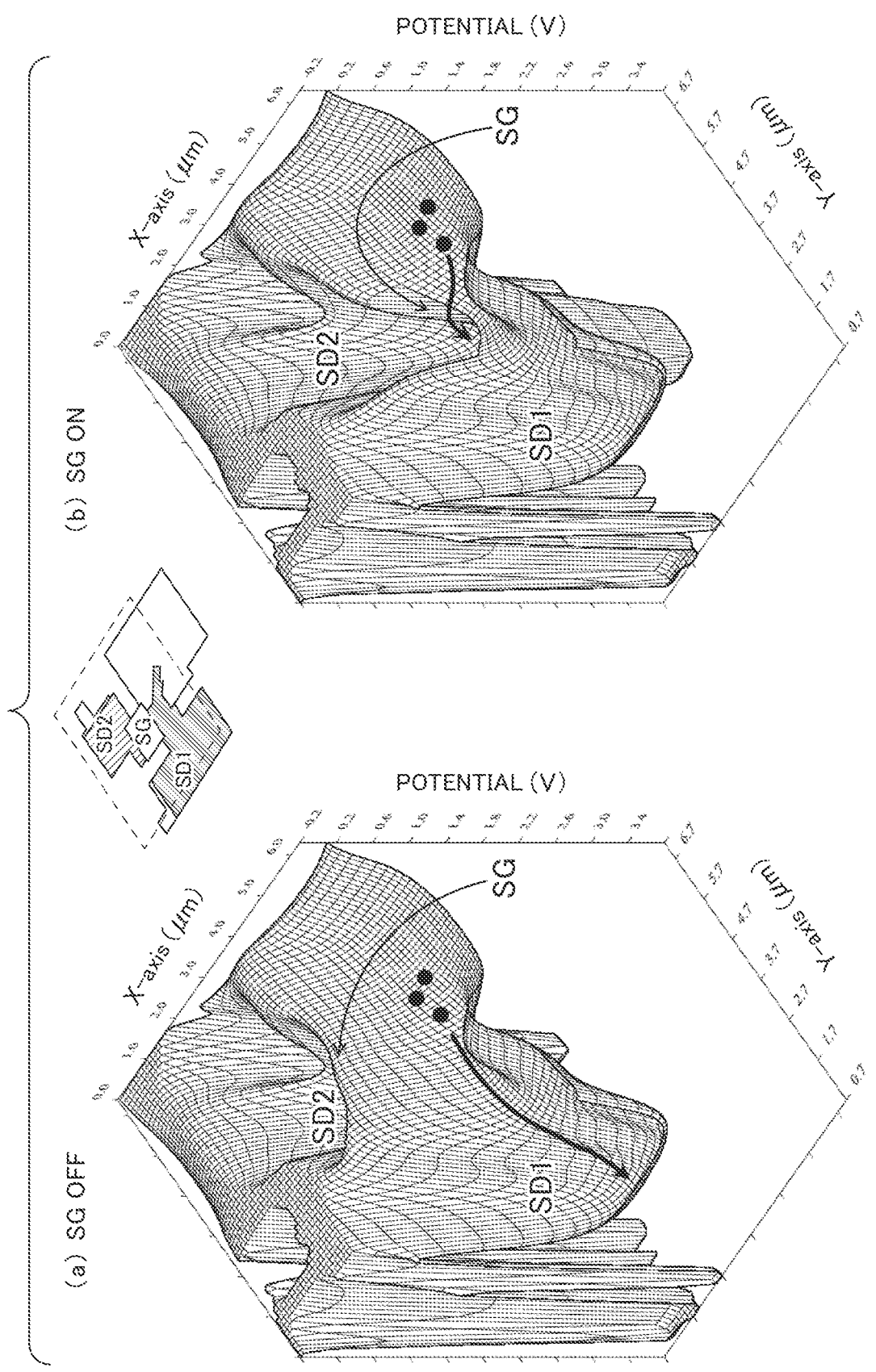

PHOTOELECTRIC CONVERSION ELEMENT AND SOLID-STATE IMAGE PICKUP DEVICE

TECHNICAL FIELD

The present invention relates to a photoelectric conversion element, and a solid-state image pickup device (solid-state image sensor) in which a plurality of the photoelectric conversion elements is arrayed as unit pixels, and more particularly relates to a photoelectric conversion element and a solid-state image sensor, which has a wide dynamic range.

BACKGROUND ART

For a case that very bright and dark portions exist simultaneously, a solid-state image sensor having a wide dynamic range is required to facilitate an excellent imaging. Conventionally, as recited in patent literature (PTL) 1, an image sensor that has two MOS transistors in which a current amplification factor of one MOS transistor is increased to ten times higher than the current amplification factor of the other MOS transistor is proposed.

In the device of the PTL 1, signal charges that are accumulated in an accumulation region via the one MOS transistor have a sensitivity that is ten times higher than signal charges accumulated in an accumulation region via the other MOS transistor. Thus, it is possible to increase the dynamic range. However, in recent application fields such as in-vehicle cameras, monitoring cameras and the like, an image sensor of high sensitivity is required which has a high-speed response that facilitate imaging of a fast-moving target, and has a much wider dynamic range.

CITATION LIST

Patent Literature

[PTL 1] JP 2014-160878A

SUMMARY OF INVENTION

Technical Problem

In view of the above problems, an object of the present invention is to provide a photoelectric conversion element having a high sensitivity, a simple structure, a wide dynamic range and a high-speed response characteristic, which facilitate the imaging of fast-moving targets, and a solid-state image sensor in which a plurality of the unit pixels, each of which is implemented by the photoelectric conversion elements, is periodically arrayed.

Solution to Problem

In order to achieve the above object, a first aspect of the present invention inheres in a photoelectric conversion element encompassing (a) a principal layer of the first conductivity type, (b) a surface-buried region of the second conductivity type, selectively buried in an upper portion of the principal layer so as to implement a photodiode with the principal layer, (c) a first charge-accumulation region of the second conductivity type, buried in the vicinity of the surface-buried region, in an upper portion of the principal layer, configured to accumulate first signal charges transferred from the surface-buried region, the first signal charges are generated by the photodiode (PD), and (d) a second charge-accumulation region of the second conductivity type, buried in the principal layer apart from the first charge-accumulation region, configured to accumulate second signal charges transferred from the surface-buried region, the second signal charges are generated by the photodiode. In the first aspect of the present invention, a process including a first period, in which the first signal charges are transferred from the surface-buried region to the first charge-accumulation region, and a second period, in which the second signal charges are transferred from the surface-buried region to the second charge-accumulation region, the second period that is shorter than the first period, is repeated multiple times in one frame period.

A second aspect of the present invention inheres in a solid-state image sensor, wherein a plurality of unit pixels are arrayed, each of the unit pixels encompasses (a) a principal layer of the first conductivity type, (b) a surface-buried region of the second conductivity type, selectively buried in an upper portion of the principal layer so as to implement a photodiode with the principal layer, (c) a first charge-accumulation region of the second conductivity type, buried in the vicinity of the surface-buried region, in an upper portion of the principal layer, configured to accumulate first signal charges transferred from the surface-buried region, the first signal charges are generated by the photodiode (PD), and (d) a second charge-accumulation region of the second conductivity type, buried in the principal layer apart from the first charge-accumulation region, configured to accumulate second signal charges transferred from the surface-buried region, the second signal charges are generated by the photodiode. In each of the unit pixel of the second aspect of the present invention, a process including a first period, in which the first signal charges are transferred from the surface-buried region to the first charge-accumulation region, and a second period, in which the second signal charges are transferred from the surface-buried region to the second charge-accumulation region, the second period that is shorter than the first period, is repeated multiple times in one frame period.

Advantageous Effects of Invention

According to the present invention, it is possible to provide a photoelectric conversion element having a high sensitivity, a simple structure, a wide dynamic range and a high-speed response characteristic, which facilitate the imaging of fast-moving targets, and a solid-state image sensor in which a plurality of the unit pixels, each of which is implemented by the photoelectric conversion elements, is periodically arrayed.

BRIEF DESCRIPTION OF DRAWINGS

FIG. 14 (a) is a three-dimensional depletion-potential profile that corresponds to a time when −1 volt is applied to a select-gate electrode, and FIG. 14 (b) is a three-dimensional depletion-potential profile that corresponds to a time when 3.3 volts is applied to the select-gate electrode.

DESCRIPTION OF EMBODIMENTS

Figure 1:
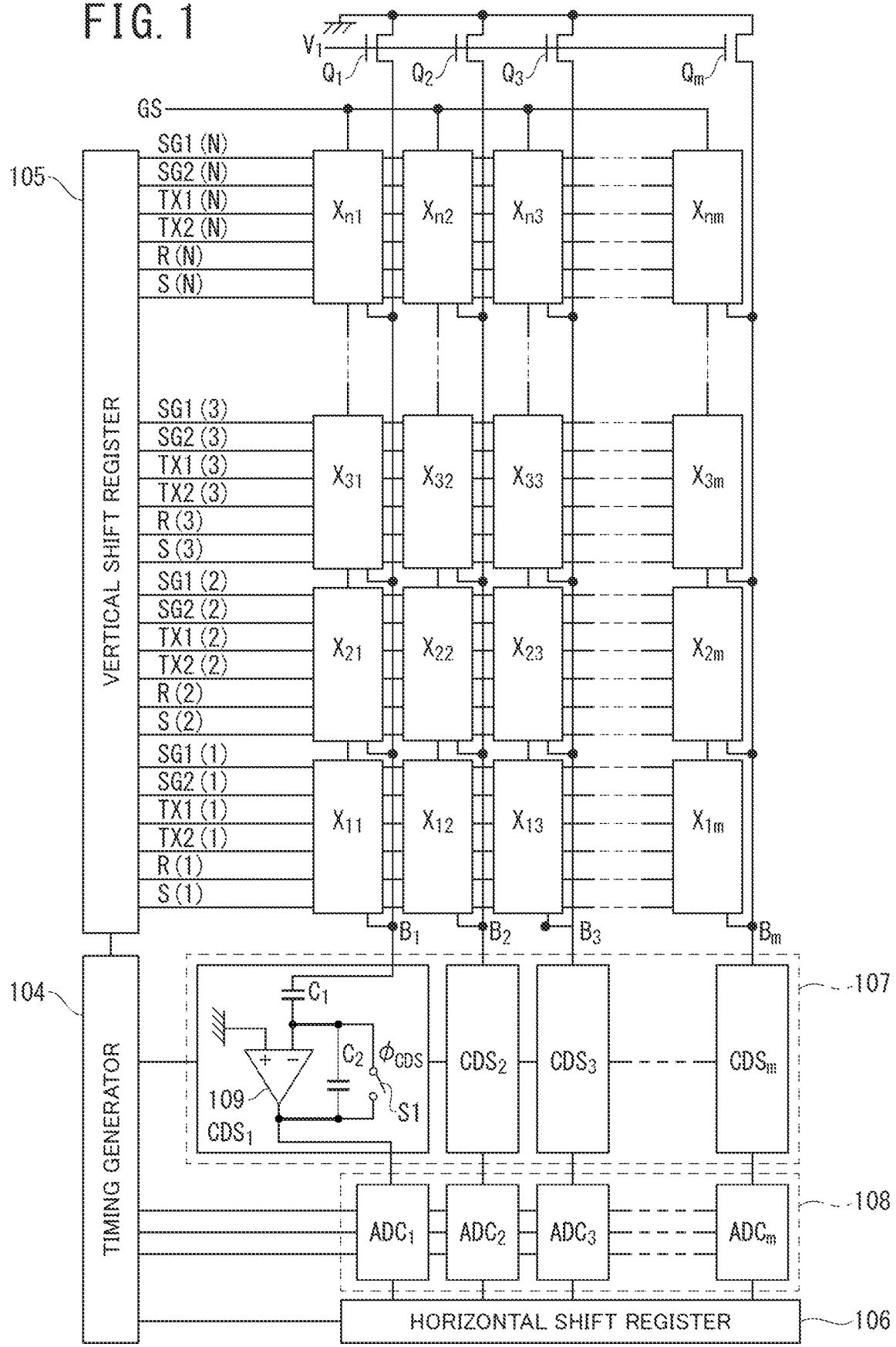
FIG. 1 is a schematic plan view illustrating an outline of a layout on a semiconductor chip merging a solid-state image sensor pertaining to a first embodiment of the present invention.

The first and second embodiments of the present invention will be described below. In the following description of the drawings, the same or similar reference numeral is assigned to the same or similar portion. However, the drawing is merely diagrammatic. Thus, attention should be paid to a fact that a relationship between a thickness and a planar dimension, a ratio between thicknesses of respective layers and the like differ from the of actual values. Hence, the concrete thicknesses and dimensions should be judged by referring to the following explanations. Also, it is natural that a portion in which the mutual dimensional relations and ratios differ from each other are included even between the mutual drawings.

In the following explanations of the first and second embodiments, all of regions, members, components and others in each of which its conductivity type is defined with "first conductivity type" or "second conductivity type" are regions, members, components and others in which their materials are semiconductors. And, in the following explanations, a case in which the first conductivity type is a p-type and the second conductivity type is an n-type is exemplified. However, by inversely selecting the conductivity type, the first conductivity type may be the n-type, and the second conductivity type may be the p-type. In a case that the first conductivity type is assigned as the p-type and the second conductivity type is the n-type, majority carriers are elected to be electrons, which will serve as signal charges. However, in a case that the first conductivity type is assigned as the n-type and the second conductivity type is the p-type, it is natural that majority carriers can be elected to be holes, serving as the signal charges. Also, in the following explanation, "left" or "right", and alternatively, "upper" or "lower" direction is merely a definition for explanatory convenience, and they are not intended to limit the technical idea of the present invention. Thus, for example, when a paper surface is rotated by 90 degrees, the orientation of "left" direction versus "right" direction and the orientation of "upper" direction versus "lower" direction are changed to be read as the orientations of the "upper" direction versus the "lower" direction and the "left" direction versus the "right" direction. When the paper surface is rotated by 180 degrees, it is natural that the "left" is changed to the "right", and the "right" is changed to the "left".

First Embodiment

In the solid-state image sensor (two-dimensional image sensor) pertaining to the first embodiment of the present invention, as illustrated in FIG. 1, a pixel-array area ($X_{11}$-$X_{1m}$; $X_{21}$ to $X_{2m}$; - - - , $X_{n1}$ to $X_{nm}$) and peripheral-circuit area (104, 105, 106, 107 and 108) are integrated on the same semiconductor chip. In the pixel-array area, a plurality of pixels $X_{ij}$ (i=1 to n, and j=1 to m, and the m and the n are integers, respectively) is arrayed in the shape of a two-dimensional matrix and implements a rectangular area to be imaged. And, on a bottom side portion of the pixel-array area in a plan view, a horizontal shift register 106 is embedded along pixel rows $X_{11}$-$X_{1m}$; $X_{21}$ to $X_{2m}$; - - -, $X_{n1}$ to $X_{nm}$ directions. On a left side portion of the pixel-array area, a vertical shift register (vertical driver circuit) 105 is embedded along pixel columns $X_{11}$-$X_{n1}$; $X_{12}$ to $X_{n2}$; - - -; $X_{1j}$ to $X_{nj}$; - - -; $X_{1m}$ to $X_{nm}$ directions. A timing generator 104 is connected to the vertical shift register (vertical driver circuit) 105 and the horizontal shift register 106.

Figure 2:
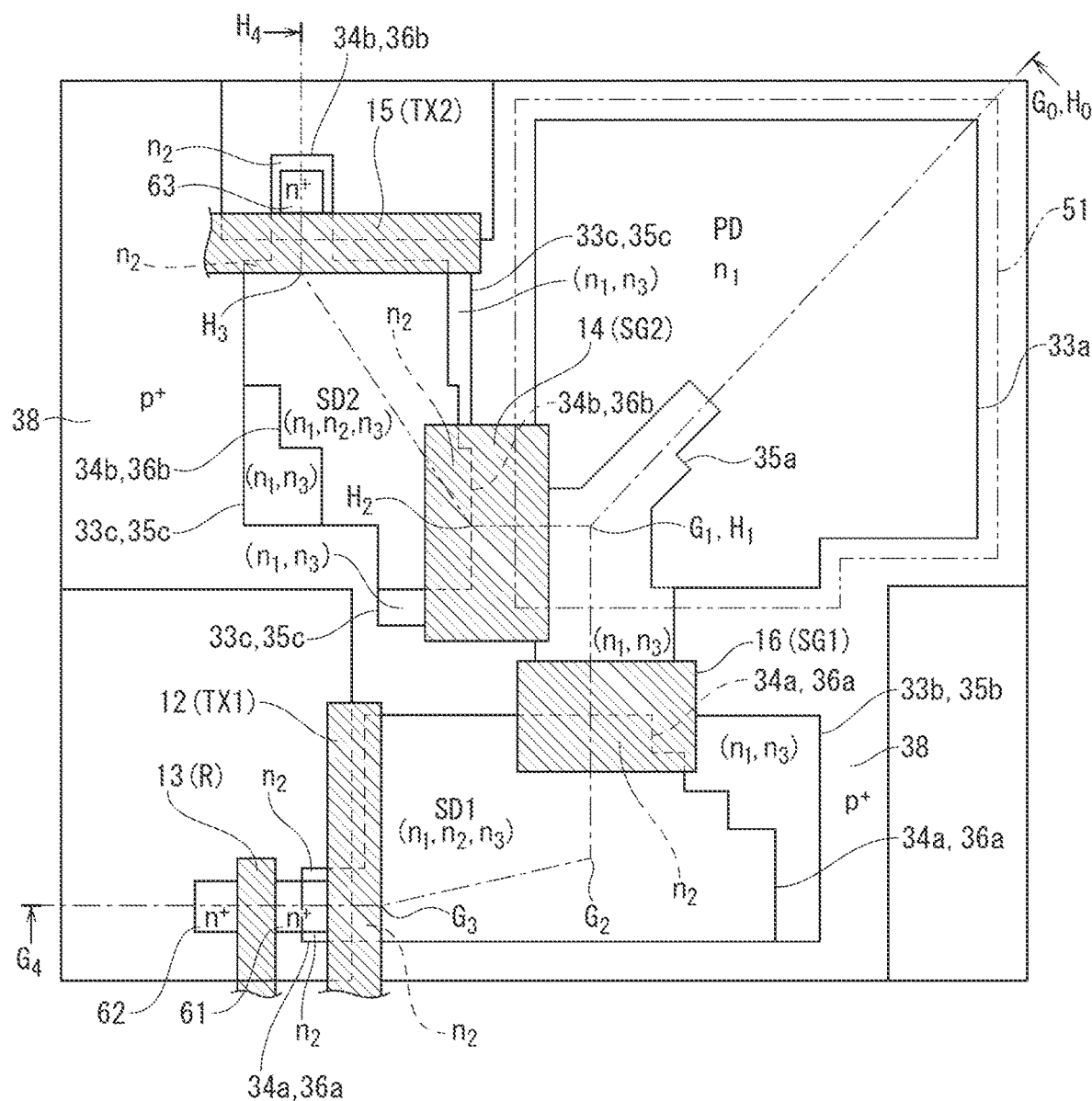
FIG. 2 is a schematic plan view (top view) illustrating the outline of a photoelectric conversion element pertaining to the first embodiment.

FIG. 2 illustrates one example of a planar structure of elements in a pixel, the elements implement an inner-pixel circuit, the inner-pixel circuit is allocated in each of the pixels $X_{11}$-$X_{1m}$; $X_{21}$ to $X_2$m; - - -, $X_{n1}$ to $X_{nm}$ of the solid-state image sensor pertaining to the first embodiment. On the upper right side in FIG. 2, a surface-buried region 33a that serves as a light-receiving cathode-region (charge-generation region) is indicated as a rectangular area. The surface-buried region 33a is the surface-buried region 33a of a second conductivity type (n-type) surrounded by a principal layer 32 (refer to FIGS. 3 and 4) of a first conductivity type (p-type). In the area of the surface-buried region 33a, there is a light-shielding plate 51 in which an opening (aperture) is opened as indicated in a two-dot chain line. In the area of the pixel other than the aperture, its upper portions are covered by the light-shielding plate 51, and light is shielded by the light-shielding plate 51. The pixel receives an optical signal entered through the aperture of the light-shielding plate 51 and photo-electrically converts the optical signal into first signal charges and second signal charges other than the first signal charges. A "first signal charge" is a signal charge whose transfer is controlled by a first select-gate electrode 16 that implements a first route-select unit illustrated in FIG. 2. A "second signal charge" is a signal charge whose transfer is controlled by a second select-gate electrode 14 that implements a second route-select unit. The detailed definition of "the first signal charge" and "the second signal charge" will be explained later in FIG. 5.

The pixels $X_{ij}$ within the pixel-array area are sequentially scanned by the timing generator 104, the horizontal shift register 106 and the vertical shift register (vertical driver circuit) 105, as illustrated in FIG. 1. Then, an operation for sorting a pixel signal to the first signal charge and the second signal charge and accumulating them and a read-out operation and an electronic-shutter operation after the sorting and accumulating operations are carried out. That is, in the solid-state image sensor pertaining to the first embodiment of the present invention, within one frame period, the vertical shift register 105 transmits a first signal-charge drive-pulse SG1 for driving a first select-gate electrode 16 and a second signal-charge drive-pulse SG2 for driving a second select-gate electrode 14 to the pixels $X_{11}$-$X_{1m}$; $X_{21}$ to $X_{2m}$; $X_{n1}$ to $X_{nm}$ complementary in multiple times. The first signal charges are accumulated in a first charge-accumulation region (a first charge-accumulation diode) SD1 illustrated in FIG. 2, by the first signal-charge drive-pulse SG1. The second signal charges are accumulated in a second charge-accumulation region (a second charge-accumulation diode) SD2, by the second signal-charge drive-pulse SG2. After that, each of the pixel rows $X_{11}$-$X_{1m}$; $X_{21}$ to $X_{2m}$; $X_{n1}$ to $X_{nm}$ are vertically scanned on the pixel-array area, by the unit of the pixel row, respectively, so that the pixel signals of the respective pixel rows $X_{11}$-$X_{1m}$; $X_{21}$ to $X_{2m}$; $X_{n1}$ to $X_{nm}$ are read out via vertical signal lines $B_1$, $B_2$, $B_3$, - - -, $B_j$, - - -, $B_m$, which are allocated to the respective pixel columns $X_{11}$-$X_{n1}$; $X_{12}$ to $X_{n2}$; - - -; $X_{1j}$ to $X_{nj}$; - - -; $X_{1m}$ to $X_{nm}$.

In the pixel signals read out from the respective vertical signal lines $B_1$, $B_2$, $B_3$, - - -, $B_j$, - - -, $B_m$, the noises of the pixel signals are cancelled in correlated double sampling circuits $CDS_1$, $CDS_2$, $CDS_3$, - - -, $CDS_m$ in a noise cancelling circuit 107. Moreover, the pixel signals are analog to digital converted by A-D converters $ADC_1$, $ADC_2$, $ADC_3$, - - -, $ADC_m$ in a signal processor 108, and then transferred to the horizontal shift register 106. The correlated double sampling circuit $CDS_1$ includes an input capacitance $C_1$ whose one electrode is connected to the vertical signal line $B_1$, an integral capacitance $C_2$ whose one electrode is connected to the other electrode of the input capacitance $C_1$, and a differential amplifier 109 whose one input terminal is connected to the other electrode of the input capacitance $C_1$. The other input terminal of the differential amplifier 109 is grounded. The other electrode of the integral capacitance $C_2$ is connected to an output terminal of the differential amplifier 109. In the differential amplifier 109, a switch S1, which can electrically short-circuit the one input terminal and the output terminal of the differential amplifier 109, is connected in parallel with the differential amplifier 109. Although the illustrations are omitted, each of the correlated double sampling circuits $CDS_2$, $CDS_3$, - - -, $CDS_m$ has a configuration similar to that of the correlated double sampling circuit $CDS_1$ illustrated in FIG. 1.

On a planar pattern illustrated in FIG. 2, the first select-gate electrode 16 and the second select-gate electrode 14, each of which has an insulated-gate structure, are arranged on a lower left side of the surface-buried region 33a, and they implement the first route-select unit and the second route-select unit, respectively. A voltage applied to the first select-gate electrode 16 induces a charge-transfer channel on a surface of a semiconductor region 32 (refer to FIG. 3) in which a charge-transfer route is defined immediately under the first select-gate electrode 16, and the first signal charges generated by the pixel are transferred to a lower direction when it is viewed in the planar pattern illustrated in FIG. 2. A voltage applied to the second select-gate electrode 14 induces a charge-transfer channel on the surface of the semiconductor region 32 (refer to FIG. 3) in which a charge-transfer route is defined immediately under the second select-gate electrode 14, and the second signal charges generated by the pixel are transferred to a left direction when it is viewed in the planar pattern illustrated in FIG. 2.

In the planar pattern illustrated in FIG. 2, a guide region (inner guide region) 35a of the second conductivity type (n-type) is arranged so as to overlap with an area on a lower left side of the surface-buried region 33a, and is allocated adjacent to the first select-gate electrode 16 and the second select-gate electrode 14. The guide region 35a has a function for guiding the first signal charges and the second signal charges to the first select-gate electrode 16 and the second select-gate electrode 14, each of which implements the route-selection mechanism, respectively, from the surface-buried region 33a. As illustrated in FIG. 2, the first charge-accumulation region (charge-accumulation diode) SD1 for temporally accumulating the first signal charges transferred by the first select-gate electrode 16 is arranged below the first select-gate electrode 16 as a polygon (in FIG. 2, a step-shaped decagon that has four steps), on a planar pattern. A first transfer-gate electrode 12 adjacent to the first charge-accumulation region SD1 and a first charge read-out region 61 of the second conductivity type ($n^+$ type) are arranged on a left side of the first charge-accumulation region SD1, the first charge read-out region 61 is allocated at an opposite side to the first charge-accumulation region SD1 with respect to the first transfer-gate electrode 12.

A reset-gate electrode 13 and a reset-drain region 62 of the second conductivity type (n$^+$ type) are arranged further to the left side of the first charge read-out region 61, the reset-drain region 62 is opposite to the first charge read-out region 61 with respect to the reset-gate electrode 13. The first charge read-out region 61, the reset-gate electrode 13 and the reset-drain region 62 implement a MOS transistor serving as a reset transistor. For the respective reset-gate electrodes 13, all of control signals R are set to a high (H) level, and the charges accumulated in the first charge read-out region 61 are exhausted to the reset-drain region 62, respectively, and the 2) first charge read-out region 61 is consequently reset.

On the other hand, the second charge-accumulation region (charge-accumulation diode) SD2 for accumulating the second signal charges transferred by the second select-gate electrode 14 is arranged as a stepped concave-polygon on the left side of the second select-gate electrode 14, the second charge-accumulation region SD2 is illustrated as an irregular tetradecagon that has four steps in FIG. 2. On the planner pattern, a second transfer-gate electrode 15 adjacent to the second charge-accumulation region SD2, and a second charge read-out region 63 of the second conductivity type (n$^+$ type) are arranged on the upper side of the second charge-accumulation region SD2, the second charge read-out region 63 is opposite to the second charge-accumulation region SD2 with respect to first transfer-gate electrode 15.

Figure 3:
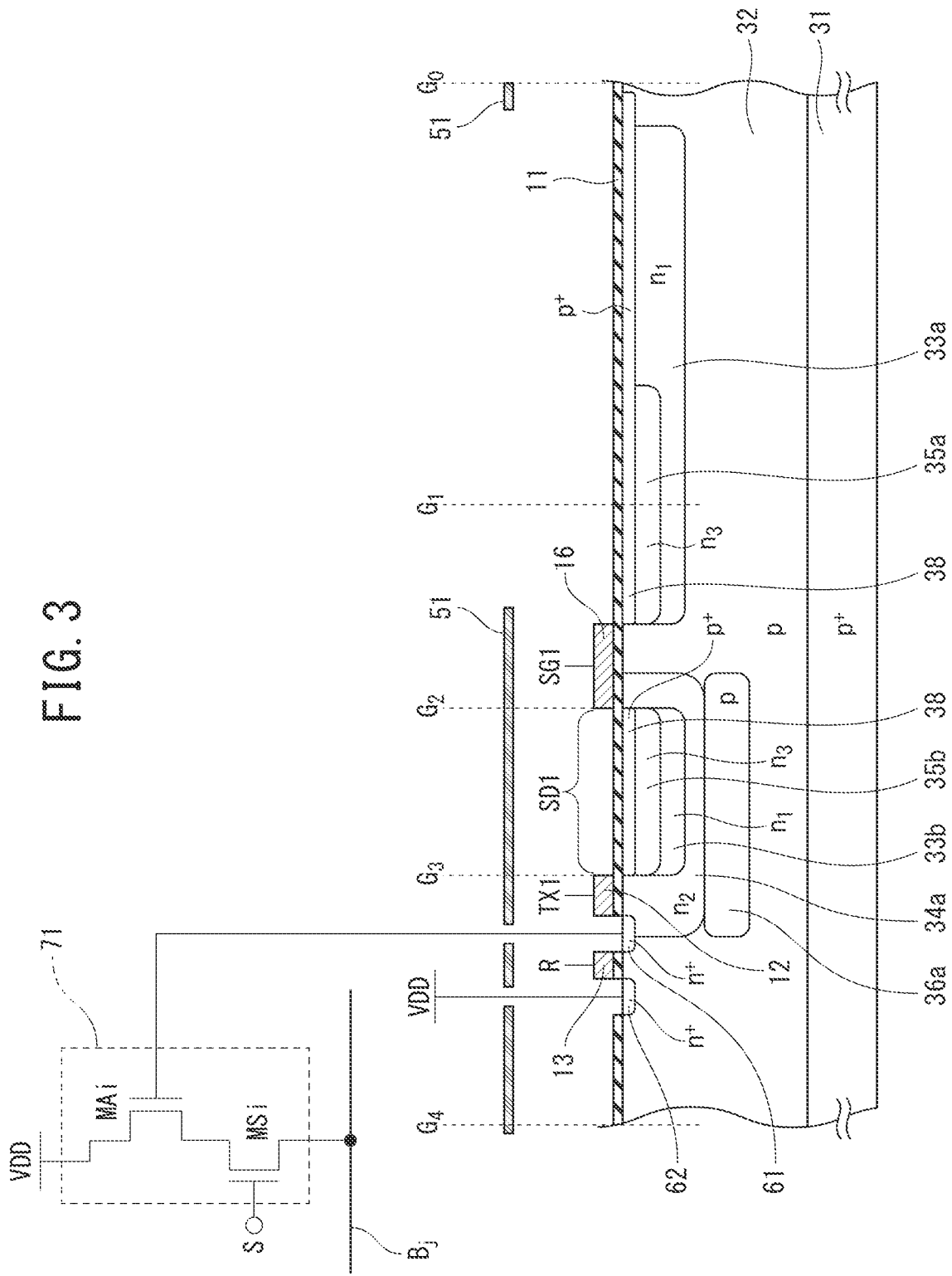
FIG. 3 is a schematic cross-sectional view illustrating the outline of the photoelectric conversion element pertaining to the first embodiment, taken along dash-dotted lines of $G_0$-$G_1$-$G_2$-$G_3$-$G_4$ in FIG. 2.

FIG. 3 is a cross-sectional structure taken along the dash-dotted lines of G$_0$-G$_1$-G$_2$-G$_3$-G$_4$ of the pixel illustrated in FIG. 2, and FIG. 3 illustrates a p$^+$ type semiconductor substrate 31, a p-type principal layer 32 which is grown by epitaxial growth method on the semiconductor substrate 31, the n-type surface-buried region 33a which is selectively buried in a part of the upper portion of the principal layer 32, and the n-type guide region 35a which is selectively buried in a part of the upper portion of the surface-buried region 33a.

Although FIG. 3 exemplifies a case that the principal layer 32 is made of a p-type epitaxial layer, the principal layer 32 is epitaxially grown on the semiconductor substrate 31 as a "principal layer of the first conductivity type", a p-type semiconductor substrate may be used as the "principal layer of the first conductivity type" instead of the p-type epitaxial layer.

As mentioned above, the surface-buried region 33a is buried in the upper portion of the principal layer 32 and serves as the light-receiving cathode-region (charge-generation region). The surface-buried region 33a and a part of the principal layer 32 immediately under the surface-buried region 33a implement a photodiode PD. The part of the principal layer 32 located immediately under the surface-buried region 33a serves as a "light-receiving anode-region (charge-generation region)". Carriers (electrons) generated in the light-receiving anode-region are injected into a part of the surface-buried region 33a directly above the principal layer 32.

A p$^+$ type pinning layer 38 is arranged on the surface-buried region 33a. The p$^+$ type pinning layer 38 is the layer for suppressing the generation of the carriers at a surface in dark time and used as the layer preferred to decrease a dark current. In an application field and the like in which the dark current is not problematic, the p$^+$ type pinning layer 38 may be omitted as structure.

At the vicinity of the surface-buried region 33a and the guide region 35a which are located in the upper portion of the principal layer 32, an n-type first well region 34a that is located apart from the surface-buried region 33a and the guide region 35a is arranged so as to be mated with the planar pattern of the polygon in FIG. 2. In a part of the upper portion of the first well region 34a, an n-type first potential-gradient generation-region 33b is arranged so as to be mated with the planar pattern of a polygon (right-angled octagon) in FIG. 2. On the top surface of the first potential-gradient generation-region 33b, an n-type first outer-guide region 35b is arranged while overlapping with the planar pattern of the polygon. On the bottom surface of the first well region 34a, a p-type first buried-accumulation region 36a is arranged so as to be mated with the planar pattern of the polygon. The first charge-accumulation region SD1 is implemented by the duplicated region of the first well region 34a, the first potential-gradient generation-region 33b and the first outer-guide region 35b. As illustrated on the left side in FIG. 3, the first charge read-out region 61 and the reset-drain region 62 which implement the reset transistor are arranged in a part of the upper portion of the principal layer 32.

A gate insulating film 11 is arranged on the p$^+$ type pinning layer 38 and the principal layer 32. As the gate insulating film 11, silicon oxide film (SiO$_2$ film) is preferable. However, it is allowable to form an insulated-gate structure of an insulated gate transistor (MIS transistor) that uses various insulating films other than the silicon oxide film (SiO$_2$ film). For example, it is allowable to use an ONO film composed of a triple level film of silicon oxide film (SiO$_2$ film)/silicon nitride film (Si$_3$N$_4$ film)/silicon oxide film (SiO$_2$ film). Moreover, as the gate insulating film 11, it is possible to use the oxide that includes at least one element of strontium (Sr), aluminum (Al), magnesium (Mg), yttrium (Y), hafnium (Hf), zirconium (Zr), tantalum (Ta) and bismuth (Bi), or the silicon nitride that includes the above elements or the like.

In FIG. 3, the first select-gate electrode 16 for transferring the first signal charges from the surface-buried region 33a to the first charge-accumulation region SD1 is arranged on the gate insulating film 11 on 3) the right side of the first charge-accumulation region SD1. Also, the first transfer-gate electrode 12 for transferring the first signal charges from the first charge-accumulation region SD1 to the first charge read-out region 61 is arranged on the gate insulating film 11 on the left side of the first charge-accumulation region SD1. Moreover, on the gate insulating film 11 on the principal layer 32 on the left side of the first transfer-gate electrode 12, the reset-gate electrode 13 is arranged apart from the first transfer-gate electrode 12. Then, the first charge read-out region 61, the reset-gate electrode 13 and the reset-drain region 62 implement the reset transistor.

A gate electrode of a signal read-out transistor (amplifying transistor) MAi that implements a voltage read-out buffer-amplifier 71 is connected to the first charge read-out region 61. A drain electrode of the signal read-out transistor (amplifying transistor) MAi is connected to an power supply VDD, and a source electrode is connected to a drain electrode of a pixel-select switching-transistor MSi. A source electrode of the pixel-select switching-transistor MSi is connected to a vertical signal line and a select-control signal S of a horizontal line is given to a gate electrode from the vertical shift register (vertical driver circuit) 105 illustrated in FIG. 1. By setting the select-control signal S to the high (H) level, the switching transistor MSi is turned on, and a current that corresponds to a potential of the first charge-accumulation region SD1 which is amplified by the signal read-out transistor (amplifying transistor) MAi flows through the vertical signal line B$_j$.

In the cross-sectional structure illustrated in FIG. 3, an impurity concentration of the semiconductor substrate 31 is higher than an impurity concentration of the principal layer 32 serving as a charge-generation region. That is, the semiconductor substrate 31 is preferred to have an impurity concentration between $4\times10^{17}$ cm$^{-3}$ and $1\times10^{19}$ cm$^{-3}$, and the principal layer 32 serving as the charge-generation region is preferred to have an impurity concentration between $6\times10^{11}$ cm$^{-3}$ and $2\times10^{16}$ cm$^{-3}$. In particular, when the semiconductor substrate 31 is assumed to be a silicon (Si) substrate having an impurity concentration between $4\times10^{17}$ cm$^{-3}$ and $5\times10^{18}$ cm$^{-3}$ and the principal layer 32 is assumed to be a Si epitaxial growth layer 32 having an impurity concentration between $1\times10^{12}$ cm$^{-3}$ and $2\times10^{15}$ cm$^{-3}$, it is possible to accept the general and usual CMOS process.

In industrial meaning, when the Si substrate 31 is assumed to have an impurity concentration between $8\times10^{17}$ cm$^{-3}$ and $3\times10^{18}$ cm$^{-3}$ and the Si epitaxial growth layer 32 is assumed to have an impurity concentration between $1\times10^{13}$ cm$^{-3}$ and $15\times10^{15}$ cm$^{-3}$, the above values of the impurity concentration are preferable because it is easy to obtain the epitaxial growth substrate from market. A thickness of the Si epitaxial growth layer 32 is about four micrometers to 20 micrometers. Preferably, it may be about six micrometers to ten micrometers. The surface-buried region 33a has an impurity concentration between $1\times10^{15}$ cm$^{-3}$ and $1\times10^{17}$ cm$^{-3}$. Representatively, it is possible to use the value of impurity concentration of, for example, about $5\times10^{16}$ cm$^{-3}$. The thickness of the surface-buried region 33a can be about 0.1 micrometer to three micrometers, and preferably, the thickness of the surface-buried region 33a can be about 0.5 micrometer to 1.5 micrometers.

Figure 4:
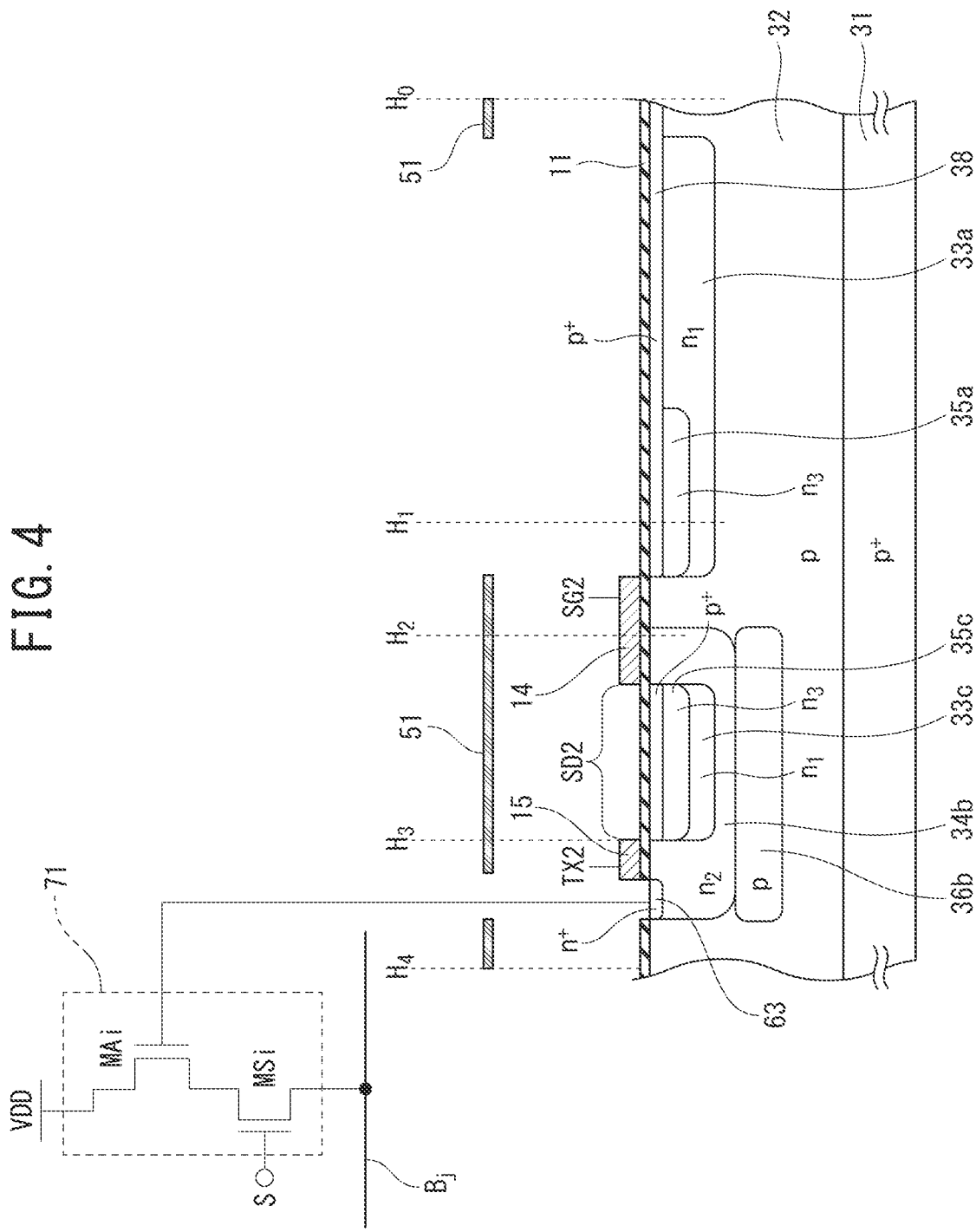
FIG. 4 is a schematic cross-sectional view illustrating the outline of the photoelectric conversion element pertaining to the first embodiment, taken along dash-dotted lines of $H_0$-$H_1$-$H_2$-$H_3$-$H_4$ in FIG. 2.

FIG. 4 is the cross-sectional structure of a pixel, which is taken along the dash-dotted lines of $H_0$-$H_1$-$H_2$-$H_3$-$H_4$ illustrated in FIG. 2. However, in a part of the upper portion of the principal layer 32, an n-type second well region 34b that is located apart from the surface-buried region 33a and the guide region 35a is arranged so as to be mated with the planar pattern of the polygon in FIG. 2. In a part of the upper portion of the second well region 34b, an n-type second potential-gradient generation-region 33c is buried correspondingly to the planar pattern of the polygon in FIG. 2. On the top surface of the second potential-gradient generation-region 33c, an n-type second outer-guide region 35c is arranged while overlapping with the planar pattern of the polygon. On the bottom surface of the second well region 34b, a p-type second buried-accumulation region 36b is arranged so as to be mated with the planar pattern of the polygon. The second charge-accumulation region SD2 is implemented by the duplicated region of the second well region 34b, the second potential-gradient generation-region 33c and the second outer-guide region 35c.

In the upper portion of the left side of the second well region 34b, the n-type second charge read-out region 63 is buried so as to be located apart from the second potential-gradient generation-region 33c and the second outer-guide region 35c. Although illustration is omitted in FIG. 2, the second charge read-out region 63 is connected to the first charge read-out region 61 through a metallic interconnection. Thus, the voltage read-out buffer-amplifier 71 is connected even to the second charge read-out region 63, and the second signal charges accumulated in the second charge-accumulation region SD2 are read out in accordance with time sequence, independently of an operation for reading out the first signal charges accumulated in the first charge-accumulation region SD1. Here, FIG. 4 exemplifies a case in which the voltage read-out buffer-amplifier 71 reads out the second signal charges in accordance with time sequence in common with the first signal charges. However, it is allowed to connect the other voltage read-out buffer-amplifier, which differs from the voltage read-out buffer-amplifier 71, to the second charge read-out region 63 and read out the second signal charges accumulated in the second charge-accumulation region SD2, simultaneously, independently of the operation for reading out the first signal charges accumulated in the first charge-accumulation region SD1.

The second select-gate electrode 14 for transferring the second signal charges from the surface-buried region 33a to the second charge-accumulation region SD2 is arranged on the gate insulating film 11 on the right side of the second charge-accumulation region SD2. Moreover, the second transfer-gate electrode 15 for transferring the second signal charges from the second charge-accumulation region SD2 to the second charge read-out region 63 is arranged on the gate insulating film 11 on the left side of the second charge-accumulation region SD2.

Next, one example of the charge transferring operation in the solid-state image sensor pertaining to the first embodiment of the present invention is explained with reference to timing charts in FIGS. 5 (a) to 5 (d). Each abscissa of FIGS. 5 (a) to 5 (d) indicates a time within one frame period. The ordinate of FIG. 5 (a) indicates the change of the voltage of a first signal-charge drive-pulse SG1 that is applied to the first select-gate electrode 16, and the ordinate of FIG. 5 (b) indicates the change of the voltage of a second signal-charge drive-pulse SG2 that is applied to the second select-gate electrode 14. The ordinate of FIG. 5 (c) indicates the accumulated charge quantity of the first signal charges accumulated in the first charge-accumulation region SD1, and the ordinate of FIG. 5 (b) indicates the accumulated charge quantity of the second signal charges accumulated in the second charge-accumulation region SD2.

Figure 5:
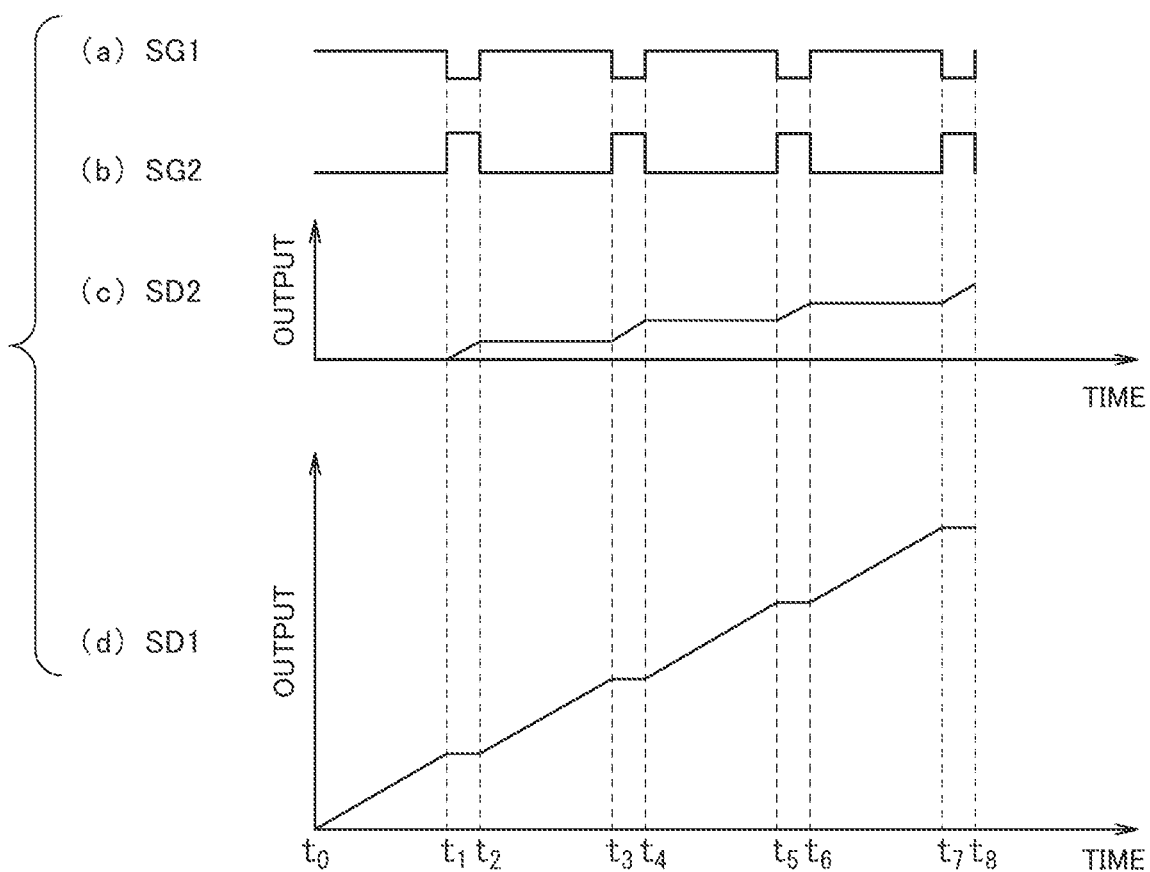
FIG. 5 (a) is a view illustrating a waveform of a first signal-charge drive-pulse which is applied to a first select-gate electrode of the photoelectric conversion element pertaining to the first embodiment, and FIG. 5 (b) is a view illustrating a waveform of a second signal-charge drive-pulse which is applied to a second select-gate electrode of the photoelectric conversion element pertaining to the first embodiment to explain a relationship with FIG. 5 (a), and FIG. 5 (c) is a timing chart of an output from a first charge-accumulation region in the photoelectric conversion element pertaining to the first embodiment to explain a relationship with FIGS. 5 (a) and 5 (b), and FIG. 5 (d) is a timing chart of an output from a second charge-accumulation region in the photoelectric conversion element pertaining to the first embodiment, explaining a relationship with FIGS. 5 (a) and 5 (b).

As illustrated in FIGS. 5 (a) and 5 (b), the first signal-charge drive-pulse SG1 and the second signal-charge drive-pulse SG2, which differ from each other in phase and complementary with each other, are applied to the first select-gate electrode 16 and the second select-gate electrode 14, respectively. Consequently, the first signal charges and the second signal charges are alternately assigned to the first charge-accumulation region SD1 and the second charge-accumulation region SD2. Concretely, in a period between times t0 and t1, or a first period illustrated in FIG. 5 (a), the first select-gate electrode 16 is turned on by the first signal-charge drive-pulse SG1, and the first signal charges are transferred to the first charge-accumulation region SD1. Then, as illustrated in FIG. 5 (d), the first signal charges are accumulated in the first charge-accumulation region SD1. On the other hand, as illustrated in FIG. 5 (b), the second select-gate electrode 14 is turned off by the second signal-charge drive-pulse SG2, complementary to the first select-gate electrode 16. Thus, the second signal charges are not transferred to the second charge-accumulation region SD2. Then, the second signal charges accumulated in the second charge-accumulation region SD2 are constant, as illustrated in FIG. 5 (c).

In a period between times t1 and t2, or a second period that is shorter in time than the period between the times t0 and t1, as illustrated in FIG. 5 (a), the first select-gate electrode 16 is turned off by the first signal-charge drive-pulse SG1. Thus, the first signal charges are not transferred to the first charge-accumulation region SD1, and the first signal charges accumulated in the first charge-accumulation region SD1 are constant as illustrated in FIG. 5 (d). On the other hand, as illustrated in FIG. 5 (b), the second select-gate electrode 14 is turned on by the second signal-charge drive-pulse SG2, complementary to the first select-gate electrode 16. Hence, the second signal charges are transferred to the second charge-accumulation region SD2, and the second signal charges are accumulated in the second charge-accumulation region SD2, as illustrated in FIG. 5 (c).

That is, by changing the duty of pulses, with which the carriers, or the photo-excited electrons are accumulated in the first charge-accumulation region SD1 and the second charge-accumulation region SD2, the first signal charges are accumulated in the first charge-accumulation region SD1 by a long-time exposure, and the second signal charges are complementary accumulated in the second charge-accumulation region SD2 by a short-time exposure. That is, the "first signal charge" can be defined as the signal charge that is accumulated in the first charge-accumulation region SD1 by the long-time exposure illustrated in FIG. 5 (a). On the other hand, the "second signal charge" is the signal charge other than the first signal charge, among the signal charges that are generated via the photoelectric conversion by the photodiode PD. Hence, the second signal charge is the signal charge that is accumulated in the second charge-accumulation region SD2 by the short-time exposure illustrated in FIG. 5 (b).

The complementary combination of the long-time exposure between the times t0 and t1 and the short-time exposure between the times t1 and t2 are repeated in a period between times t2 and t3, a period between times t3 and t4, a period between times t4 and t5, a period between times t5 and t6, a period between times t6 and t7 and a period between times t7 and t8 within the one frame, alternately and cyclically. In addition, FIG. 5 exemplifies a case in which the complementary combination of the long-time exposure and the short-time exposure is repeated quadruple times. However, the complementary combination of the long-time exposure and the short-time exposure may be repeated at least twice and may be repeated more than quintuple times. At the time t8 at which the one frame finishes, the first signal charges and the second signal charges, which are accumulated in the first charge-accumulation region SD1 and the second charge-accumulation region SD2, are read out, respectively, in accordance with time sequence.

Figure 6:
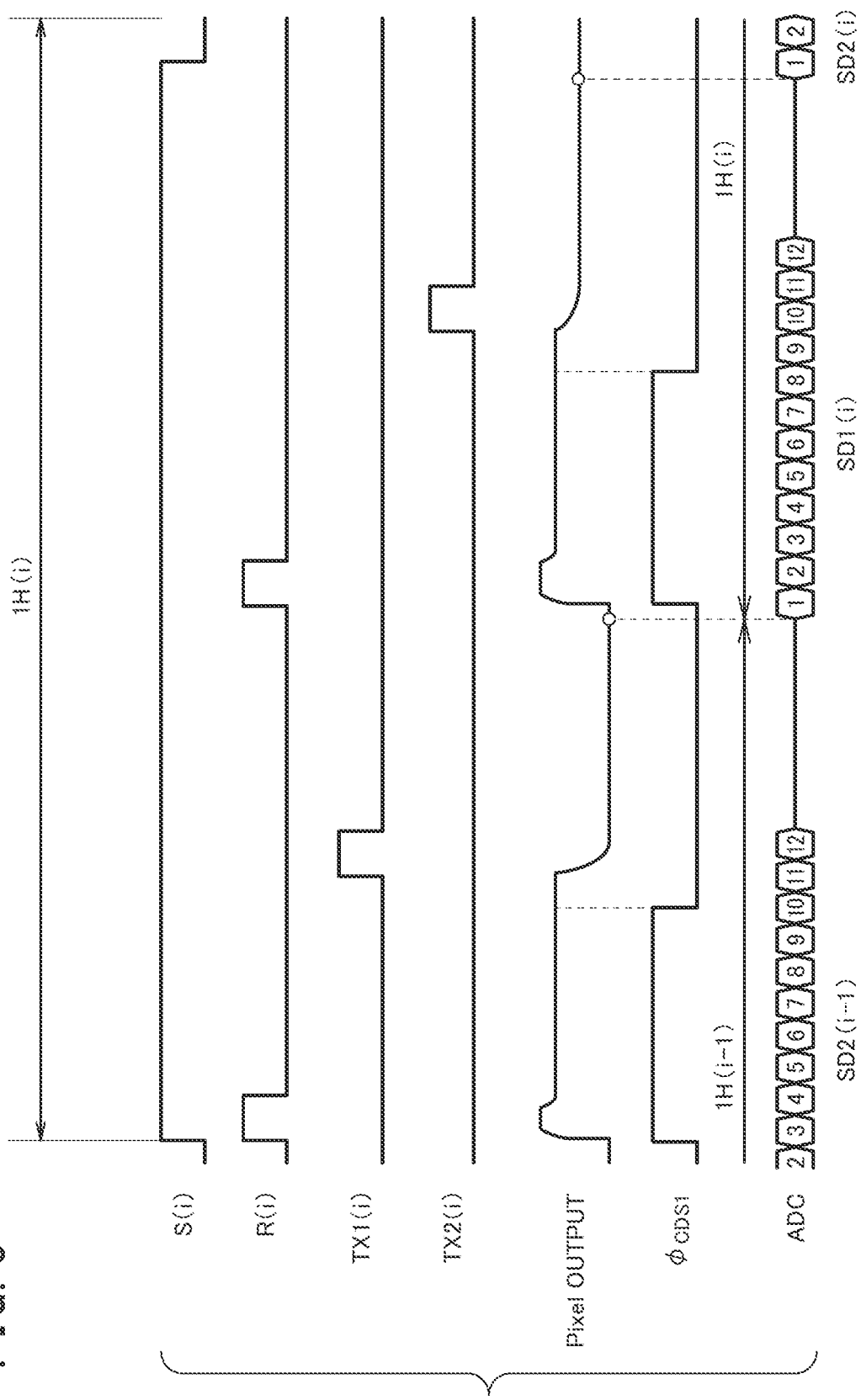
FIG. 6 is a timing chart that explains a read-out method of signal charges in the first and second charge-accumulation regions of the photoelectric conversion element pertaining to the first embodiment.

Next, one example of a read-out method of the first signal charges and the second signal charges, which are accumulated in the first charge-accumulation region SD1 and the second charge-accumulation region SD2, respectively, in accordance with the time sequence is explained by referring to the timing chart in FIG. 6. FIG. 6 illustrates, in an order starting from the top of the page, the temporal changes of a vertical selection signal S(i) to pixel rows $X_{i1}$ to $X_{im}$ on an $i^{th}$ row, a reset signal R(i), a control signal TX1(i) applied to the first transfer-gate electrode 12, a control signal TX2(i) applied to the second transfer-gate electrode 15, an output signal from the pixel $X_{ij}$, a control signal $\phi_{CDS1}$ for controlling respective switches S1 within correlated double sampling circuits $CDS_1$, $CDS_9$, $CDS_3$, - - -, $CDS_m$, and output values ADCs after AD conversion by AD converters $ADC_1$, $ADC_2$, $ADC_3$, - - -, $ADC_m$, respectively, in the signal processor 108.

At first, in a horizontal read-out period 1H(i) on the $i^{th}$ row, potentials of the first charge-accumulation region SD1 and the second charge-accumulation region SD2 within the pixel $X_{ij}$ are reset by setting the reset signal R(i) to a high (H) level (Ri="1"). Moreover, in the correlated double sampling circuits $CDS_1$, $CDS_2$, $CDS_3$, - - -, $CDS_m$ in the noise cancelling circuit 107 illustrated in FIG. 1, by turning on the respective switches S1 (close state) ($\phi_{CDS1}$="1") and further setting the vertical selection signal S(i) to a high level (Si="1"), potential levels in reset states of the first charge read-out region 61 and the second charge read-out region 63 within the pixel $X_{ij}$ are sampled through the vertical signal line B to the input capacitance C1 in FIG. 1. At the time of the sampling of the potential levels, the AD converters $ADC_1$, $ADC_2$, $ADC_3$, - - -, $ADC_m$ in the signal processor 108 AD-convert the pixel output, which corresponds to the second signal charges read out in the latter half in a horizontal read-out period 1H (i–1) on an $(i–1)^{th}$ row, and feed a digital signal SD2(i–1).

After that, in each of the correlated double sampling circuits $CDS_1$, $CDS_2$, $CDS_3$, - - -, $CDS_m$ in the noise cancelling circuit 107 illustrated in FIG. 1, the differential amplifier 109 is set to an amplification mode ($\phi_{CDS1}$="0"). Next, the control signal TX1(i) is applied to the first transfer-gate electrode 12, and the first signal charges are transferred from the first charge-accumulation region SD1 to the first charge read-out region 61. As a result, the potential of the first charge read-out region 61 is changed, and a high sensitive signal, from which fixed pattern noise of the pixel $X_{ij}$ and reset noise are removed, is provided through the output of the differential amplifier 109.

Again, the potentials of the first charge read-out region 61 and the second charge read-out region 63 within the pixel $X_{ij}$, are reset by setting the reset signal R(i) to the high (H) level (Ri="1"). While the vertical selection signal S(i) is kept at the high level (Si="1"), in the correlated double sampling circuits $CDS_1$, $CDS_2$, $CDS_3$, - - -, $CDS_m$ in the noise cancelling circuit 107 illustrated in FIG. 1, by turning on the respective switches S1, or making the closed state of the respective switches S1 ($\phi_{CDS1}$="1"), the potential levels in the reset states of the first charge read-out region 61 and the second charge read-out region 63 within the pixel $X_{ij}$ are sampled through the vertical signal line to the input capacitance C1 in FIG. 1. The AD converters $ADC_1$, $ADC_2$, $ADC_3$, - - -, $ADC_m$ in the signal processor 108 AD-convert the pixel output, which corresponds to the first signal charges read out in the former half in the horizontal read-out period 1H (i) on the $i^{th}$ row, and feed a digital signal SD1(i).

After that, in the correlated double sampling circuits $CDS_1$, $CDS_2$, $CDS_3$, - - -, $CDS_m$ in the noise cancelling circuit 107 illustrated in FIG. 1, by turning off the respective switches 51, the differential amplifier 109 in FIG. 1 is set to the amplification mode ($\phi_{CDS1}$="0"). Next, the control signal TX2(i) is applied to the first transfer-gate electrode 15, and the second signal charges are transferred from the second charge-accumulation region SD2 to the second charge read-out region 63. As a result, the potential of the second charge read-out region 63 is changed, and a low sensitive signal, from which the fixed pattern noise of the pixel $X_{ij}$ and the reset noise are removed, is provided through the output of the differential amplifier 109. The AD converters $ADC_1$, $ADC_2$, $ADC_3$, - - -, $ADC_m$ in the signal processor 108 AD-convert the pixel output, which corresponds to the second signal charges read out in the latter half in the horizontal read-out period 1H (i) on the $i^{th}$ row, and feed a digital signal SD2(i).

Figure 7:
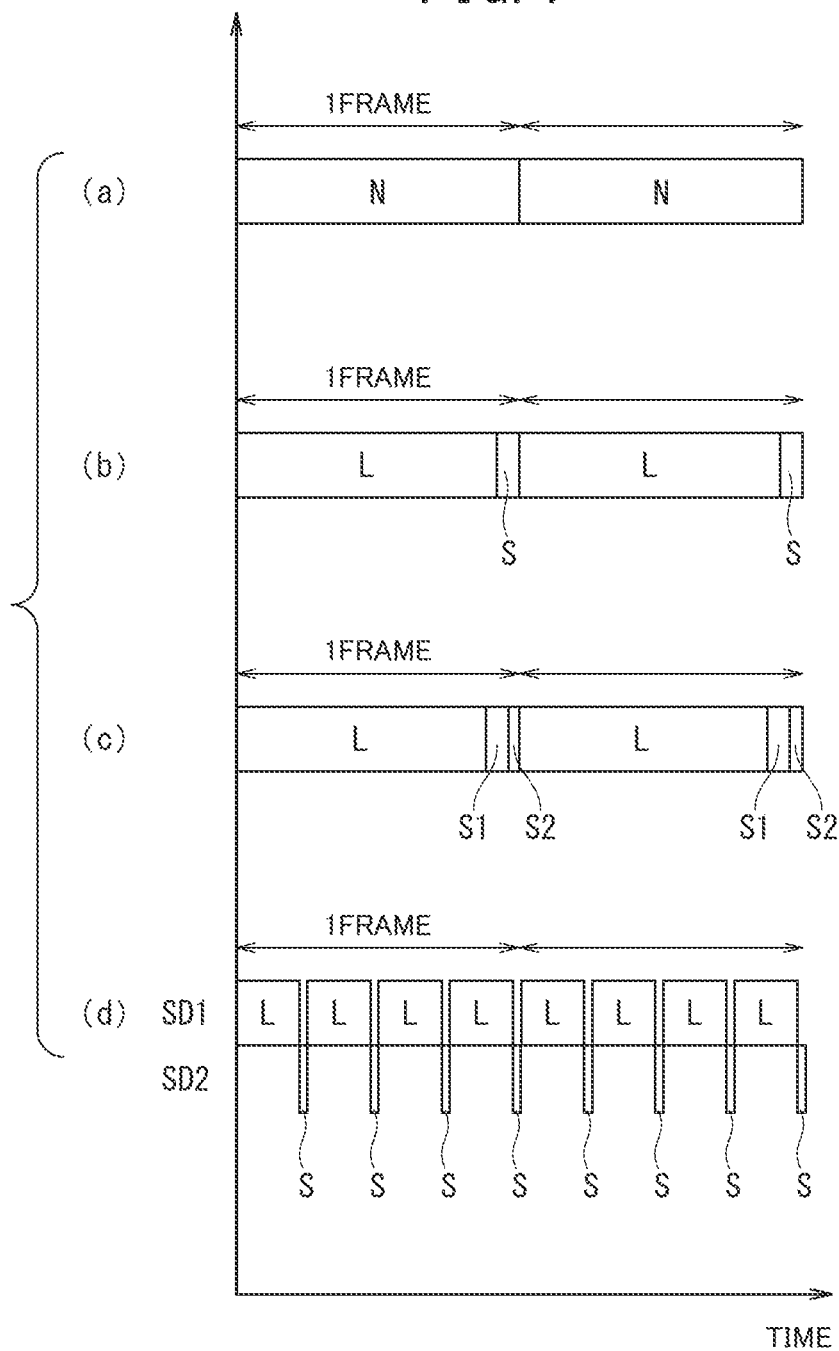
FIG. 7 (a) is a view illustrating a read-out method of signal charges pertaining to a first comparison example, and FIG. 7 (b) is a view illustrating a read-out method of signal charges pertaining to a second comparison example to explain a relationship with FIG. 7 (a), and FIG. (c) is a view illustrating a read-out method of signal charges pertaining to a third comparison example, explaining a relationship with FIGS. 7 (a) and 7 (b), and FIG. 7 (d) is a view illustrating a read-out method of signal charges of the photoelectric conversion element pertaining to the first embodiment, explaining a relationship with FIGS. 7 (a) to 7 (c).

Here, as illustrated in FIG. 7 (a), in the general and usual imaging method of a conventional image sensor, the carriers, or the photo-excited electrons are accumulated only for a time N of one frame and read out. In the foregoing read-out method of the conventional image sensor, an optical illuminance becomes high. Then, when the surface-buried region, or the light-receiving cathode-region is saturated within the time N of the one frame, white-skipped area is generated. If an accumulation time N within the one frame is set short in order to avoid the white-skipped area, a signal in a low illumination intensity regime is made small and buried in noise. Consequently, black-crushed part is generated.

Also, as illustrated in FIG. 7 (*b*), in order to achieve a wide dynamic range, there was an earlier method that divides one frame period into a long-time exposure period L and a short-time exposure period S and synthesizes an accumulation signal of the long-time exposure period L and an accumulation signal of the short-time exposure period S. However, in the earlier method illustrated in FIG. 7 (*b*), a sampling window of the short-time exposure period S was small as compared with a frame period, and an interval between the short-time exposure periods S was separated by approximately one frame period. Thus, there was a problem of unnatural motion-distortion was generated in imaging a fast-moving target.

Also, as illustrated in FIG. 7 (*c*), there was an earlier method that divides one frame period into a long-time exposure period L, a short-time exposure period S1 and a super short-time exposure period S2, and reads different signals of the long-time exposure period L, the short-time exposure period S1 and the super short-time exposure period S2, respectively, and synthesizes them. Even in the earlier method of FIG. 7 (*c*), each of the sampling windows of the short-time exposure period S1 and the super short-time exposure period S2 becomes small as compared with the frame period. Thus, each of an interval between the short-time exposure periods S1 and an interval between the super short-time exposure periods S2 was separated by an approximately one frame period. Hence, there was also the problem that the unnaturally motion-distortion is generated in imaging the fast-moving target.

On the contrary, according to the solid-state image sensor pertaining to the first embodiment, as illustrated in FIG. 7 (*d*), a sequence of processes, in which in the long-time exposure period L, the first signal charges are accumulated in the first charge-accumulation region SD1, and in the short-time exposure period S, the second signal charges are accumulated in the second charge-accumulation region SD2, is repeated multiple times in one frame period. Consequently, even in imaging the fast-moving target, an interval between the short-time exposure periods S adjacent to each other is small as compared with FIGS. 7 (*b*) and 7 (*c*). Thus, the unnaturally motion-distortion is reduced. Hence, it is possible to obtain a high dynamic range by synthesizing the signals of the first charge-accumulation region SD1 and the second charge-accumulation region SD2, in which their sensitivities are different, for example, about 400:1.

As mentioned above, because the first embodiment of the present invention encompasses the double-route selection-mechanism of the first select-gate electrode 16 and the second select-gate electrode 14, the first select-gate electrode 16 and the second select-gate electrode 14 can selectively sort the first signal charge and the second signal charge to the first charge-accumulation region SD1 and the second charge-accumulation region SD2, respectively, multiple times in one frame period. At that time, the first charge-accumulation region SD1 and the second charge-accumulation region SD2 are used to perform the time division, and the long-time exposure period L and the short-time exposure period S are repeated alternately and complementary in multiple times, and the signals having the two sensitivities are accumulated and read out repeatedly with multiple times in one frame period, and it is consequently possible to obtain the wide dynamic range image that has a small motion-distortion with respect to a high-speed moving target. Thus, the image sensor according to the first embodiment is suitable for a case in which the movement of the imaging target is high speed, and the illumination intensity changes sharply and greatly in situations such as a headlight of a vehicle, a monitoring camera or the like, Modification of First Embodiment A photoelectric conversion element pertaining to a modification of the first embodiment differs from the photoelectric conversion element pertaining to the first embodiment, in that as illustrated in FIG. 8, the photoelectric conversion element of the modification encompasses a first route-select unit with a pair of first field-control electrodes (16*a* and 16*b*) and a second route-select unit with a pair of second field-control electrodes (14*a* and 14*b*), each of which is implemented by a pair of field-control electrodes, instead of the first select-gate electrode 16 and the second select-gate electrode 14 in the photoelectric conversion element explained in the first embodiment illustrated in FIG. 2.

Figure 8:
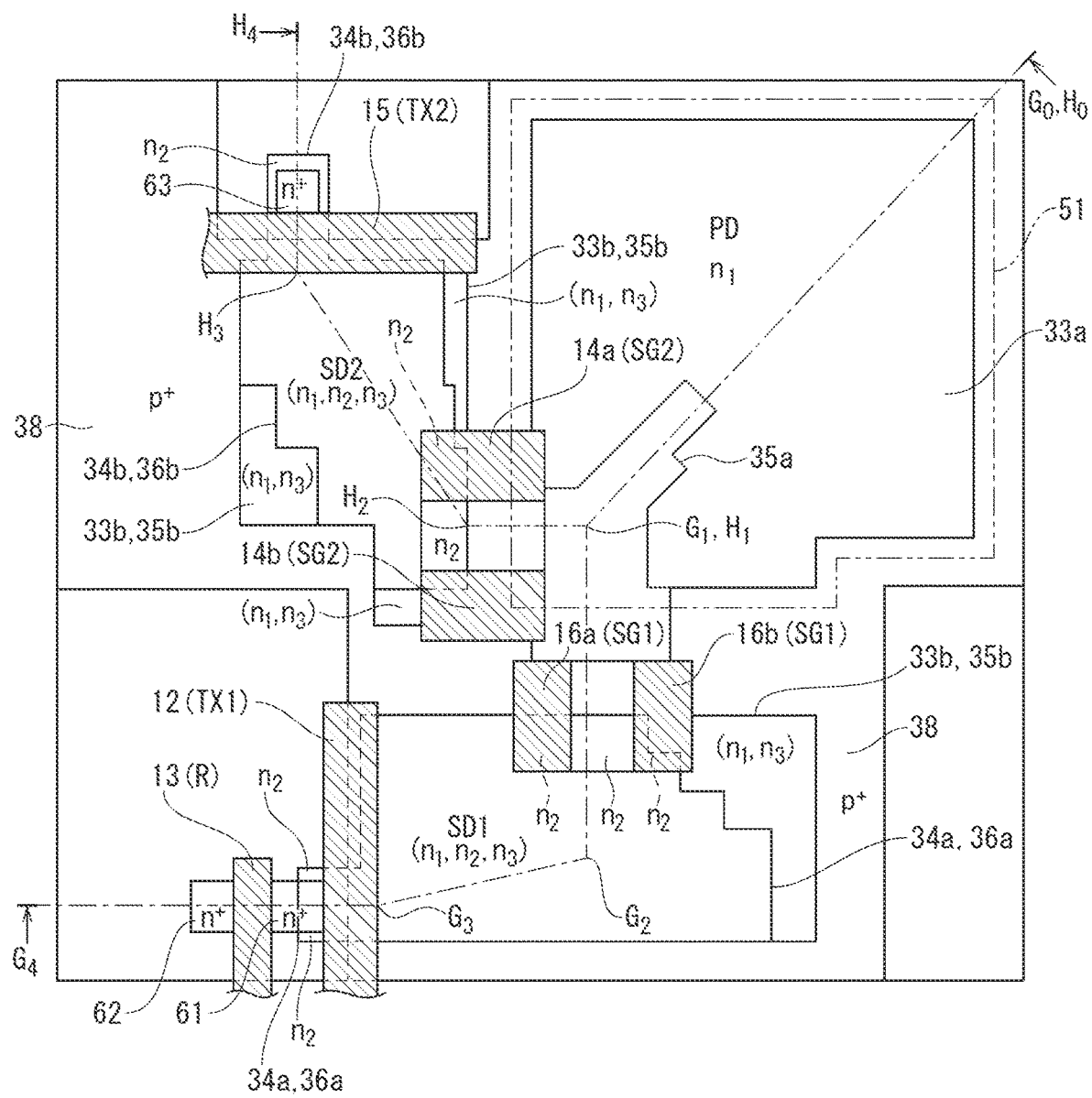
FIG. 8 is a schematic plan view (top view) that illustrates an outline of a photoelectric conversion element pertaining to a modification of the first embodiment.

As can be understood from FIG. 8, an field-control electrode, or the gate electrode is not arranged directly above a charge-transfer route, or the channel through which the first signal charges of the first route-select unit (16*a* and 16*b*) move. Similarly, the field-control electrode, or the gate electrode is not arranged directly above the charge-transfer route, or the channel through which the second signal charges of the second route-select unit (14*a* and 14*b*) move. That is, the channel does not exist in the semiconductor regions immediately under the gate electrodes—field-control electrodes—that implement the insulated-gate structures of the first route-select unit (16*a* and 16*b*) and the second route-select unit (14*a* and 14*b*). The channel is not allocated in the semiconductor regions immediately under the field-control electrodes that implement the first route-select unit (16*a* and 16*b*) and the second route-select unit (14*a* and 14*b*), and the channel is assigned in the charge-transfer route (charge transferring direction) that is defined between a pair of field-control electrodes. In the foregoing configuration, the potential and electric field of the charge-transfer route, or the channel are controlled by static induction effect due to electric lines of force, which extend in a lateral direction orthogonal to the charge-transfer route, for each of the charge-transfer routes.

Because the field-control electrode that implements each of the first route-select unit (16*a* and 16*b*) and the second route-select unit (14*a* and 14*b*) is not arranged directly above the charge-transfer route, immediately under the gate electrode such as the gate structure of the conventional MOS transistor, surface potential is not controlled in a vertical direction, or the depth direction. In the photoelectric conversion element pertaining to the modification of the first embodiment illustrated in FIG. 8, the potentials of the charge-transfer routes are controlled, respectively, by the static induction effect exerted by the electric lines of force, which extend in accordance with the Gauss's law in each lateral direction, in the first route-select unit (16*a* and 16*b*) and the second route-select unit (14*a* and 14*b*). By using the static induction effect due to the lateral electric field, it is possible to achieve the photoelectric conversion element for transferring each of the first signal charges and the second signal charges, in such a way that the electric field is held substantially constant over a long distance in a charge-transfer direction.

The photoelectric conversion element pertaining to the modification of the first embodiment illustrated in FIG. 8 includes the double-route selection-mechanism of the first route-select unit (16*a* and 16*b*) and the second route-select unit (14a and 14b) each of which uses the lateral electric field. For this reason, similarly to the illustrations in the timing charts in FIGS. 5 (a) to 5 (c), the first route-select unit (16a and 16b) and the second route-select unit (14a and 14b) can sort and transfer the first signal charges to the first charge-accumulation region SD1 and the second signal charges to the second charge-accumulation region SD2, selectively with multiple times, by using the static induction effect due to the lateral electric field, within one frame period. At that time, one frame is temporally divided so that the long-time exposure period L and the short-time exposure period S can be repeated alternately and complimentary with multiple times, so that the first signal charges and the second signal charges are selectively accumulated in the first charge-accumulation region SD1 and the second charge-accumulation region SD2, respectively and repeatedly with multiple times in one frame period, and so that the first signal charges and the second signal charges can be read out, respectively, in accordance with the time sequence. Thus, even the photoelectric conversion element pertaining to the modification of the first embodiment illustrated in FIG. 8 and the solid-state image sensor, which is implemented by the photoelectric conversion elements, can provide the technical advantages similar to the structures illustrated in FIGS. 2 to 4 and the like, and it is possible to obtain the wide dynamic range image with a smaller in motion-distortion with respect to the high-speed moving target.

Second Embodiment

Figure 9:
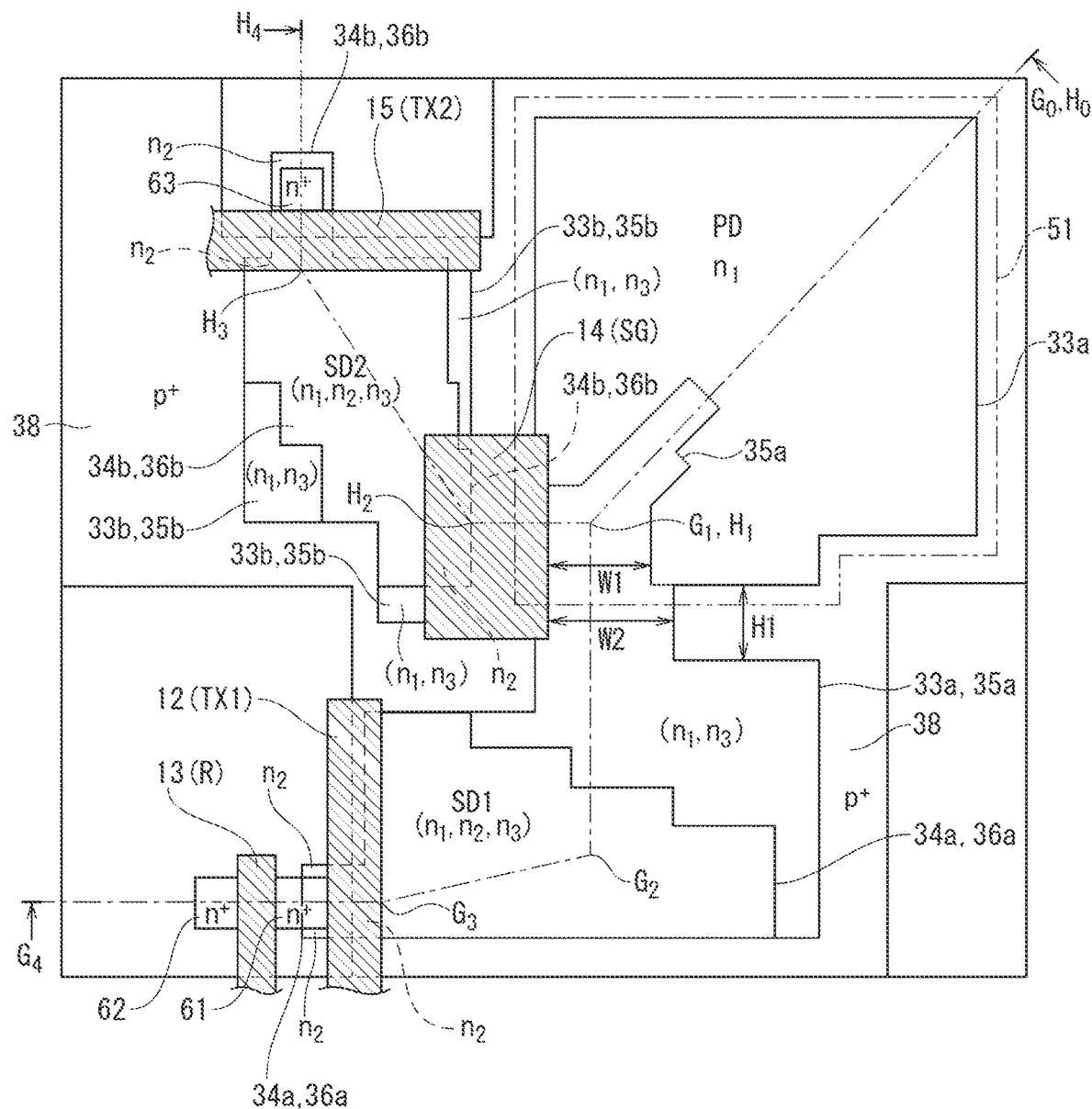
FIG. 9 is a schematic plan view (top view) that illustrates an outline of a photoelectric conversion element pertaining to a second embodiment of the present invention.

The entire configuration of the arrangement and the like on a semiconductor chip, which merges a solid-state image sensor, or the two-dimensional image sensor pertaining to the second embodiment of the present invention, is similar to the configuration illustrated in FIG. 1, as an outline. FIG. 9 illustrates one example of a planar structure of a pixel, which includes an inner-pixel circuit in each of the pixels $X_{11}$-$X_{1m}$; $X_{21}$ to $X_{2m}$; - - - , $X_{n1}$ to $X_{nm}$ in the solid-state image sensor pertaining to the second embodiment. On the upper right side of a plan view illustrated in FIG. 9, a surface-buried region 33a that serves as a light-receiving cathode-region, or the charge-generation region is indicated as a rectangular area. The surface-buried region 33a is the n-type surface-buried region 33a that is selectively buried in an upper portion of a p-type principal layer 32. The pixel receives an optical signal that is entered through an opening of a light-shielding plate 51 and converts the optical signal into first and second signal charges.

On the left side of the lower left portion of the rectangular area in the surface-buried region 33a, a select-gate electrode 14 of an insulated-gate structure is arranged so as to serve as a route-selection mechanism, or the second route-select unit. However, a select-gate electrode that implements the general and usual insulated-gate structure is not arranged in a lower route-selection mechanism, or the first route-select unit. That is, the photoelectric conversion element pertaining to the second embodiment of the present invention has the double-route selection-mechanism. However, only one route-selection mechanism has the select-gate electrode 14 that is driven by the peripheral circuits, such as the vertical shift register (vertical driver circuit) 105 and the like, which are exemplified in FIG. 1. For this reason, not only a layout within the pixel but also a topology on the semiconductor chip, such as interconnections to drive the select-gate electrode and the like, are simplified.

The select-gate electrode 14, which implements the second route-select unit that is a direct-drive route-selection mechanism, is directly driven by a signal-charge drive-pulse SG from the peripheral circuit, and transfers the second signal charges, which are generated by the surface-buried region 33a, to the second charge-accumulation region SD2 and accumulates the second signal charges in the second charge-accumulation region SD2. On the contrary, the first route-select unit is an indirect-drive route-selection mechanism for indirectly controlling the movement of the first signal charges generated by the surface-buried region 33a, because the change in the potential within a charge-transfer route which implements the first route-select unit is induced by the static induction effect from the second route-select unit—the change of the potential in the charge-transfer route will be described later by using FIGS. 10 to 13. Ascribable to the static induction effect, by appearance, the first route-select unit can be construed as a self route-selection mechanism, which transfers automatically the first signal charges from the surface-buried region 33a to the first charge-accumulation region SD1, at a particular timing, without being driven by the peripheral circuit.

In the planar pattern illustrated in FIG. 9, the surface-buried region 33a is shaped as a rectangular gourd, which has a constriction defined by relatively thin widths W1 and W2 on the right side of the select-gate electrode 14. The widths of the charge-transfer route are defined by W1 and W2. Then, at a lower side of the rectangular gourd, a rectangular area, which is thicker in width than the widths W1 and W2 of charge-transfer route, is allocated. In a part of the thicker rectangular area on the lower left side of the surface-buried region 33a, the first charge-accumulation region SD1, which is shaped as a polygon, or as illustrated in FIG. 9, a right-angled decagon having terraced quadruple steps, overlaps with a pattern of the surface-buried region 33a. Also, an n-type guide region (an insertion-guide region) 35a, which is shaped as a complicated polygon, or a heptadecagon in FIG. 9, is arranged in such a way that it extends from the lower left portion of the upper rectangular area, which is assigned at the upper right portion of the surface-buried region 33a, to a lower side direction. The lower side of the n-type guide region 35a overlaps with the thicker rectangular area allocated at the lower side of the surface-buried region 33a. The guide region 35a has a function for guiding the first signal charges from the surface-buried region 33a to a direction of the first charge-accumulation region SD1, and further has a function for guiding the second signal charges to a direction of the second charge-accumulation region SD2. The tip portion of the guide region 35a, which is allocated at the upper right side of the polygon, protrudes from the lower left side of the upper rectangular area, which is assigned at the upper right portion of the surface-buried region 33a, toward the center of the rectangular area of the surface-buried region 33a, along a G0-G1 direction, or the diagonal direction.

On the left side of the first charge-accumulation region SD1, there are arranged a first transfer-gate electrode 12 adjacent to the first charge-accumulation region SD1 and a first charge read-out region 61, which is opposite to the first charge-accumulation region SD1 with respect to the first transfer-gate electrode 12. Further to the left side of the first charge read-out region 61, there are arranged a reset-gate electrode 13 and a reset-drain region 62 which is opposite to the first charge read-out region 61 with respect to the reset-gate electrode 13. The first charge read-out region 61, the reset-gate electrode 13 and the reset-drain region 62 implement a MOS transistor serving as a reset transistor. For the respective reset-gate electrodes 13, all of the control signals R are set to the high (H) level, and the charges accumulated in the first charge read-out region 61 are exhausted to the reset-drain region 62, respectively, and the first charge read-out region 61 is consequently reset.

On the other hand, the second charge-accumulation region SD2 for accumulating the second signal charges transferred by the select-gate electrode 14 is arranged on the left side of the second select-gate electrode 14. On the upper side of the second charge-accumulation region SD2, there are arranged the second transfer-gate electrode 15 adjacent to the second charge-accumulation region SD2, and the second charge read-out region 63 opposite to the second charge-accumulation region SD2 with respect to the second transfer-gate electrode 15.

Figure 10A:
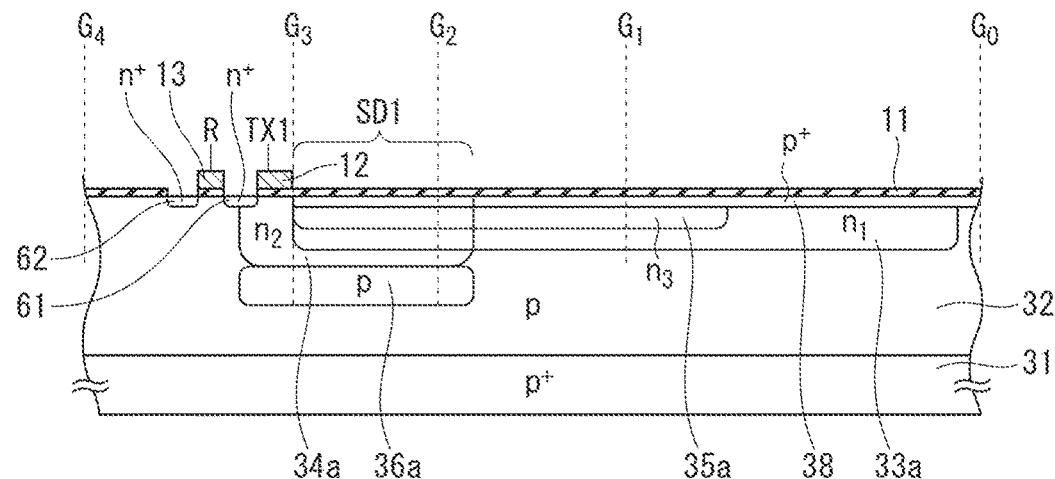
FIG. 10A is a schematic cross-sectional view illustrating the outline of the photoelectric conversion element pertaining to the second embodiment, taken along dash-dotted lines of $G_0$-$G_1$-$G_2$-$G_3$-$G_4$ in FIG. 9.

FIG. 10A illustrates a cross-sectional structure of a pixel taken along the dash-dotted lines of $G_0$-$G_1$-$G_2$-$G_3$-$G_4$ of the pixel illustrated in FIG. 9 and also illustrates a $p^+$ type semiconductor substrate 31, a p-type principal layer 32 arranged on the semiconductor substrate 31, an n-type surface-buried region 33a buried in a part of the upper portion of the principal layer 32, and an n-type guide region 35a buried in a part of the upper portion of the surface-buried region 33a.

A rectangular area defined in the surface-buried region 33a, which is buried in the upper portion of the principal layer 32, the rectangular area is represented by an opening, or an aperture of the light-shielding plate 51, the opening is indicated by a two-dot chain line in FIG. 9, serves as a light-receiving cathode-region, or the charge-generation region. A photodiode PD is implemented by the surface-buried region 33a, and a partial region of the principal layer 32 that serves as a light-receiving anode-region immediately under the surface-buried region 33a. Carriers, or electrons generated in the charge-generation region—light-receiving anode-region—are injected into a part of the surface-buried region 33a directly above the principal layer 32. The surface-buried region 33a and the guide region 35a extend downwardly from the surface-buried region 33a that defines the periphery of the opening, or the aperture indicated by the two-dot chain line on the upper right side in a plan view illustrated in FIG. 9. In FIG. 10A, the surface-buried region 33a and the guide region 35a extend from the right side to the left side, and the end portion of the left side overlaps with the upper portion of the n-type first well region 34a corresponding to the planar pattern illustrated in FIG. 9.

A $p^+$ type pinning layer 38 is arranged on the surface-buried region 33a. However, in an application field and the like in which the dark current is not problematic, the $p^+$ type pinning layer 38 may be omitted as structure. As illustrated on the left side in FIG. 10A, in the upper portion of the principal layer 32, the n-type first well region 34a is buried in such a way that a part of the first well region 34a duplicates with areas defined by the surface-buried region 33a and the guide region 35a. On the bottom surface of the first well region 34a, a p-type first buried-accumulation region 36a is arranged so as to be mated with the planar pattern of the first well region 34a. The first charge-accumulation region SD1 is implemented by the duplicated region of the first well region 34a, the surface-buried region 33a and the guide region 35a. The first charge read-out region 61 and the reset-drain region 62, which implement the reset transistor, are buried in the upper portion of the principal layer 32 illustrated on the left side in FIG. 10A. The first charge read-out region 61 and the reset-drain region 62 are disposed at the left side of the first charge-accumulation region SD1.

A gate insulating film 11 is arranged on the $p^+$ type pinning layer 38 and the principal layer 32. The first transfer-gate electrode 12 for transferring the first signal charges from the first charge-accumulation region SD1 to the first charge read-out region 61 is arranged on the gate insulating film 11 on the left side of the first well region 34a. Also, the reset-gate electrode 13 is arranged on the gate insulating film 11 on the principal layer 32 that is located leftward to the first well region 34a. Then, the first charge read-out region 61, the reset-gate electrode 13 and the reset-drain region 62 implement a reset transistor. Although illustration is omitted in FIG. 10A, a voltage read-out buffer-amplifier similar to the voltage read-out buffer amplifier 71 illustrated in FIG. 3 is connected to the first charge read-out region 61.

Figure 13A:
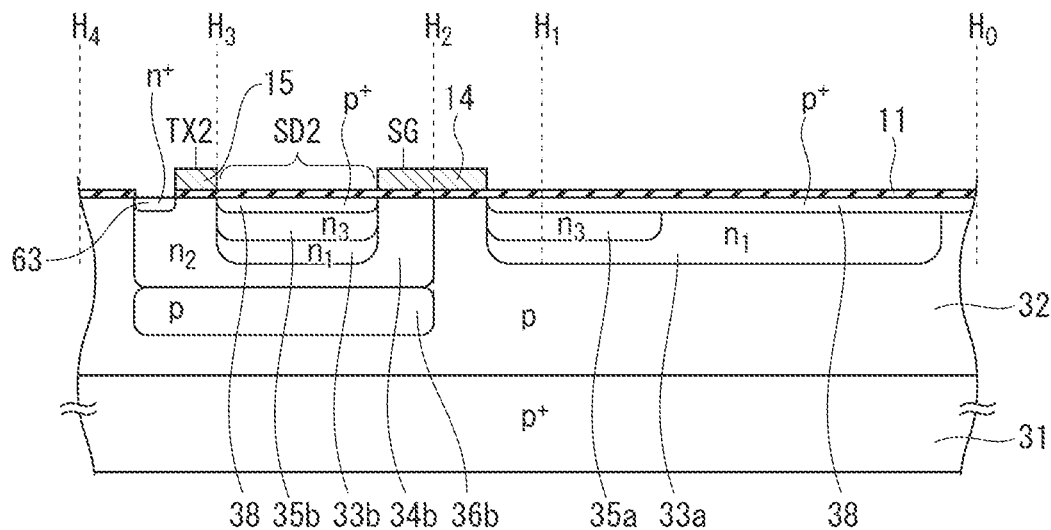
FIG. 13A is a schematic cross-sectional view illustrating the outline of the photoelectric conversion element pertaining to the second embodiment, taken along dash-dotted lines of $H_0$-$H_1$-$H_2$-$H_3$-$H_4$ in FIG. 9.

FIG. 13A illustrates the cross-sectional structure of a pixel, which is taken along the dash-dotted lines of $H_0$-$H_1$-$H_2$-$H_3$-$H_4$ illustrated in FIG. 9. However, in a part of the upper portion of the principal layer 32, an n-type second well region 34b is arranged so as to be apart from the surface-buried region 33a and the guide region 35a. In a part of the upper portion of the second well region 34b, an n-type potential-gradient generation-region 33b is arranged. On the top surface of the potential-gradient generation-region 33b, an n-type outer-guide region 35b is arranged. On the bottom surface of the second well region 34b, a p-type second buried-accumulation region 36b is arranged so as to be mated with the planar pattern of the second well region 34b. The second charge-accumulation region SD2 is implemented by the duplicated region of the second well region 34b, the potential-gradient generation-region 33b and the outer-guide region 35b.

In a part of the upper portion of the second well region 34b, the n-type second charge read-out region 63 is arranged so as to be apart from the potential-gradient generation-region 33b and the outer-guide region 35b. Although illustration is omitted in FIG. 13A, a voltage read-out buffer amplifier similar to the voltage read-out buffer-amplifier 71 illustrated in FIG. 14 is connected to the second charge read-out region 63. Then, the second signal charges accumulated in the second charge-accumulation region SD2 are read out in accordance with the time sequence, independently of an operation for reading out the first signal charges accumulated in the first charge-accumulation region SD1.

Corresponding to the topology defined by the planar pattern, the select-gate electrode 14 for transferring the second signal charges from the surface-buried region 33a to the second charge-accumulation region SD2 is arranged on the gate insulating film 11 located between the surface-buried region 33a and the second charge-accumulation region SD2. Moreover, the second transfer-gate electrode 15 for transferring the second signal charges from the second charge-accumulation region SD2 to the second charge read-out region 63 is arranged on the gate insulating film 11, which is located between the second charge-accumulation region SD2 and the second charge read-out region 63, in the planar pattern, which becomes a position on the left end side in FIG. 13A.

In the second embodiment of the present invention, a voltage applied to the select-gate electrode 14 that implements the second route-select unit illustrated in FIGS. 9 and 10A makes the change in a depletion potential in a transfer route that implements the first route-select unit, from the surface-buried region 33a to the first charge-accumulation region SD1, and consequently transfers the first signal charges, which are generated in the surface-buried region 33a, to the first charge-accumulation region SD1 automatically in appearance. That is, when the select-gate electrode 14 as the second route-select unit is turned on, the second signal charges are transferred to the second charge-accumulation region SD2, and on the side of the first route-select unit, a potential barrier in a transfer route from the surface-buried region 33a to the first charge-accumulation region SD1 is generated automatically in appearance, and the potential barrier suppresses the first signal charges from being transferred to the first charge-accumulation region SD1. On the other hand, when the select-gate electrode 14 as the second route-select unit is turned off, the second route-select unit suppresses the second signal charges from being transferred to the second charge-accumulation region SD2 and also removes the potential barrier in the transfer route of the first route-select unit from the surface-buried region 33a to the first charge-accumulation region SD1 and consequently allows the first signal charges to be transferred to the first charge-accumulation region SD1.

The magnitude of the influence of the potential of the second route-select unit on the deleted potential of the transfer route of the first route-select unit is based on the structure of the planar pattern of the pixel, or the photoelectric conversion element in the solid-state image sensor pertaining to the second embodiment and the impurity concentration in the pixel. Because the influence of the potential depends on the structure and impurity concentration of the pixel, a desirable potential barrier is not always generated in the transfer route of the first route-select unit. Thus, there is also a case of an occurrence of a "crosstalk" problem in which the signal charges flow through both of the first charge-accumulation region SD1 and the second charge-accumulation region SD2 simultaneously. Hereafter, we explain the dimensions of critical portions in reducing the crosstalk between the first charge-accumulation region SD1 and the second charge-accumulation region SD2.

By referring to FIGS. 10 to 13, results of device simulation are explained. In the device simulation, the dimensions of the critical portions of the pixel, or the photoelectric conversion element in the solid-state image sensor pertaining to the second embodiment are changed parametrically so as to obtain the height of the potential barrier with respect to the first charge-accumulation region SD1. Furthermore, by the device simulation, the presence or absence of the generation of the potential barrier in a transferring path and the like is analyzed. As the dimensions of the critical portions, in the plan view illustrated in FIG. 9, the width W1 of the transfer route from the end portion of the select-gate electrode 14 to the end portion of the guide region 35a is defined as 0.7 micrometer, and the width W2 of the area lower than the area having the width W1 of the transfer route is defined as 0.9 micrometer. Namely, in FIG. 9, a length of a portion that serves as the constriction of the torso of the gourd, which is embodied by the plan view of the surface-buried region 33a, a height H1 in the planar pattern from the upper side of the lower rectangular surface-buried region 33a to the lower side of the upper rectangular surface-buried region 33a is defined as a "route length H1", and the route length H1 is changed to 0.6 micrometer, 1.0 micrometer and 1.3 micrometers.

Figure 10B:
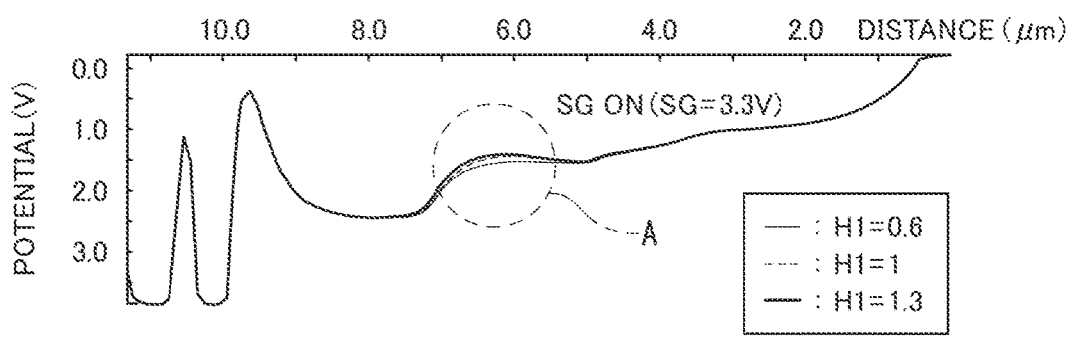
FIG. 10B is a depletion-potential profile that corresponds to a time when 3.3 volts is applied to a select-gate electrode.
Figure 10C:
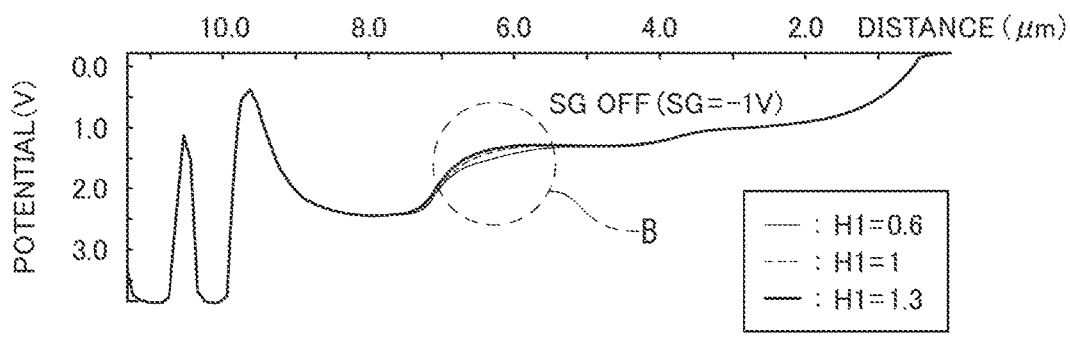
FIG. 10C is a depletion-potential profile that corresponds to a time when −1 volt is applied to the select-gate electrode.
Figure 11:
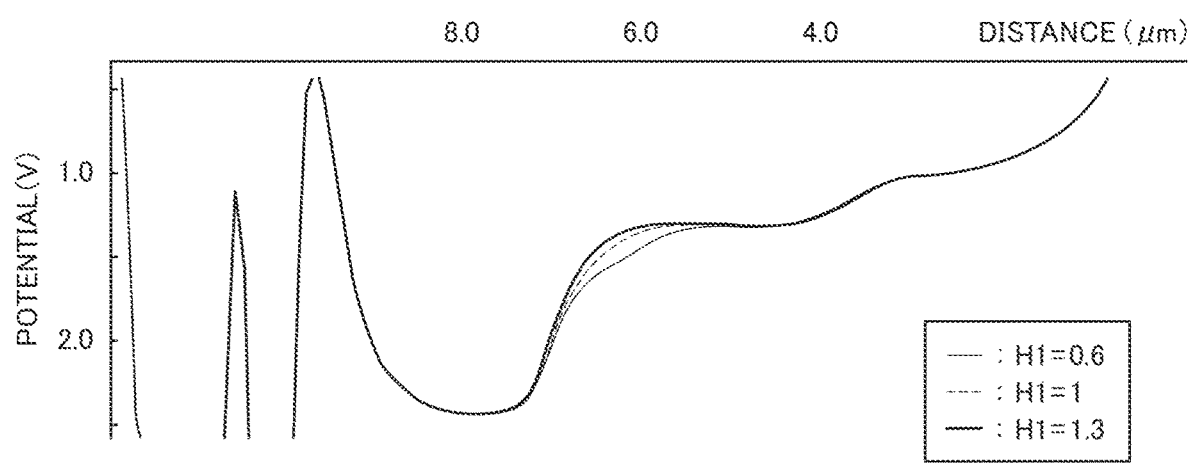
FIG. 11 is a partially enlarged view of a region B surrounded by a circle in FIG. 10C.
Figure 12:
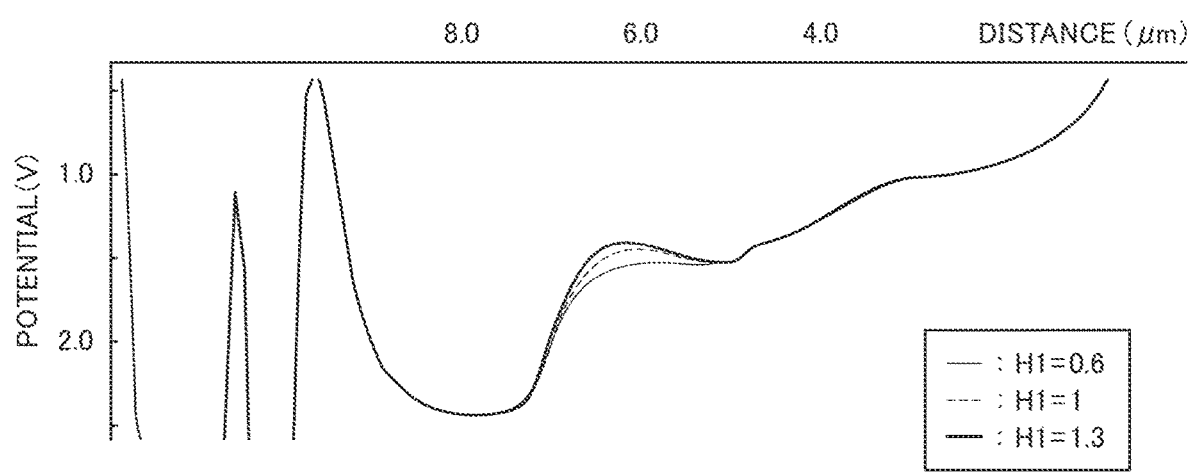
FIG. 12 is a partially enlarged view of a region A surrounded by a circle in FIG. 10B.
Figure 13B:
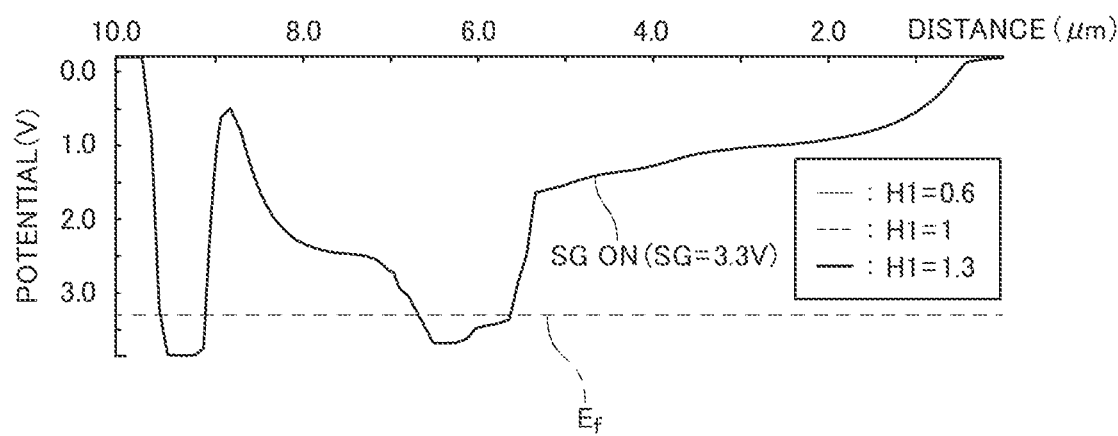
FIG. 13B is a depletion-potential profile that corresponds to a time when 3.3 volts is applied to a select-gate electrode.
Figure 13C:
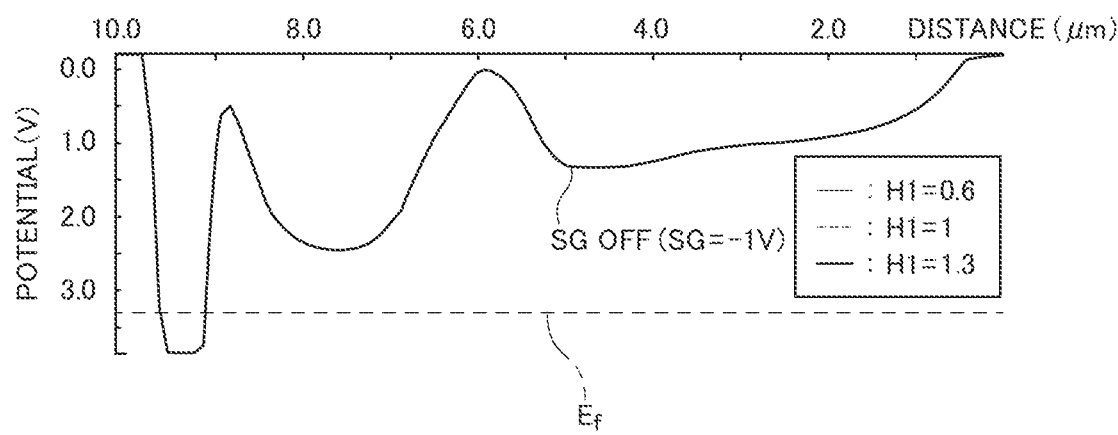
FIG. 13C is a depletion-potential profile that corresponds to a time when −1 volt is applied to the select-gate electrode.

FIG. 10B illustrates the simulation result of a depletion-potential profile in the charge-transfer route in the first mute-select unit along a cross section corresponding to FIG. 10A, when the second route-select unit is turned on by applying a signal-charge drive-pulse SG=3.3 volts to the select-gate electrode 14. FIG. 10C illustrates the simulation result of a depletion-potential profile in the charge-transfer route in the first route-select unit along the cross section corresponding to FIG. 10A, when the second route-select unit is turned off by applying a signal-charge drive-pulse SG=−1V to the select-gate electrode 14. FIG. 11 illustrates a partially enlarged view of a region B surrounded by a circle in FIG. 10C. FIG. 12 illustrates a partially enlarged view of a region A surrounded by a circle in FIG. 10B. FIG. 13B illustrates the simulation result of a depletion-potential profile in the charge-transfer route in the second route-select unit along a cross section corresponding to FIG. 13A, when the second route-select unit is turned on by applying the signal-charge drive-pulse SG=3.3 volts to the select-gate electrode 14. FIG. 13C illustrates the simulation result of a depletion-potential profile in the charge-transfer route in the second route-select unit along the cross section corresponding to FIG. 13A, when the second route-select unit is turned off by applying the signal-charge drive-pulse SG=−1V to the select-gate electrode 14.

When the select-gate electrode 14 is turned on by the signal-charge drive-pulse SG, as illustrated in FIG. 13B, the potential barrier is lowered immediately under the select-gate electrode 14. Simultaneously, as illustrated in FIGS. 10B and 12, in a portion of the guide region 35a between the surface-buried region 33a and the first charge-accumulation region SD1, in a case of the route length H1=0.6 micrometer, the potential barrier is not generated in the charge-transfer route in the first route-select unit. Thus, the movement of the first signal charges is allowed. However, in a case of the route length H1=1.0 micrometer or 1.3 micrometers, the potential barrier of 1 volt or more with respect to the first charge-accumulation region SD1 is generated in the charge-transfer route in the first route-select unit.

On the other hand, when the select-gate electrode 14 is turned off by the signal-charge drive-pulse SG, as illustrated in FIG. 13C, the potential barrier is generated immediately under the select-gate electrode 14. Simultaneously, as illustrated in FIGS. 10C and 11, in the portion of the guide region 35a between the surface-buried region 33a and the first charge-accumulation region SD1, in all of the cases of the route length H1=0.6 micrometer, 1.0 micrometer or 1.3 micrometers, the potential barrier is not generated in the charge-transfer route in the first route-select unit. Thus, the movement of the first signal charges is allowed.

Thus, in the case of the route length H1=1.3 micrometers, by a control for turning on or off the select-gate electrode 14 on the second route-select unit, the change in the height of the potential barrier can be induced to the charge-transfer route in the first route-select unit. Thus, the first signal charges and the second signal charges can be selectively sorted to the first charge-accumulation region SD1 and the second charge-accumulation region SD2. In this way, by keeping the route length H1 of the transferring path defined in the charge-transfer route, it is possible to maintain the potential barrier of the charge-transfer route in the first route-select unit. Hence, the height of the potential barrier to the first charge-accumulation region SD1 from the surface-buried region 33a along the charge-transfer route in the first route-select unit can be indirectly controlled by the signal-charge drive-pulse SG that is applied to the second route-select unit.

Moreover, FIG. 14 (a) illustrates the three-dimensional simulation result of a depletion-potential profile in the charge-transfer routes in the first and second route-select units when the second route-select unit is turned off by applying the signal-charge drive-pulse SG=−1V to the select-gate electrode 14. FIG. 14 (b) illustrates the three-dimensional simulation result of a depletion-potential profile in the charge-transfer routes in the first and second route-select units when the second route-select unit is turned on by applying the signal-charge drive-pulse SG=3.3 volts to the select-gate electrode 14. The upper right portion in FIG. 14 (a) schematically illustrates a positional relationship of the depletion-potential profiles between the select-gate electrode 14—the position of the select-gate electrode is labelled with "SG"—, the first charge-accumulation region SD1 and the second charge-accumulation region SD2, the positions are corresponding to the depletion-potentials illustrated in FIGS. 14 (a) and (b). The X-axis and Y-axis in FIGS. 14 (a) and 14 (b) correspond to a vertical direction on a paper surface of FIG. 9, and a horizontal direction on the paper surface, respectively.

As illustrated in FIG. 14 (a), when the second route-select unit is turned off by applying the signal-charge drive-pulse SG=−1V to the select-gate electrode 14, the potential barrier is generated immediately under the select-gate electrode 14, and simultaneously, the potential barrier is not generated in the charge-transfer route in the first route-select unit. Thus, the movement of the first signal charges is allowed. On the other hand, as illustrated in FIG. 14 (b), when the second route-select unit is turned on by applying the signal-charge drive-pulse SG=3.3 volts to the select-gate electrode 14, the potential barrier is lowered immediately under the select-gate electrode 14, and simultaneously, the potential barrier is generated in the charge-transfer route in the first route-select unit.

Figure 15:
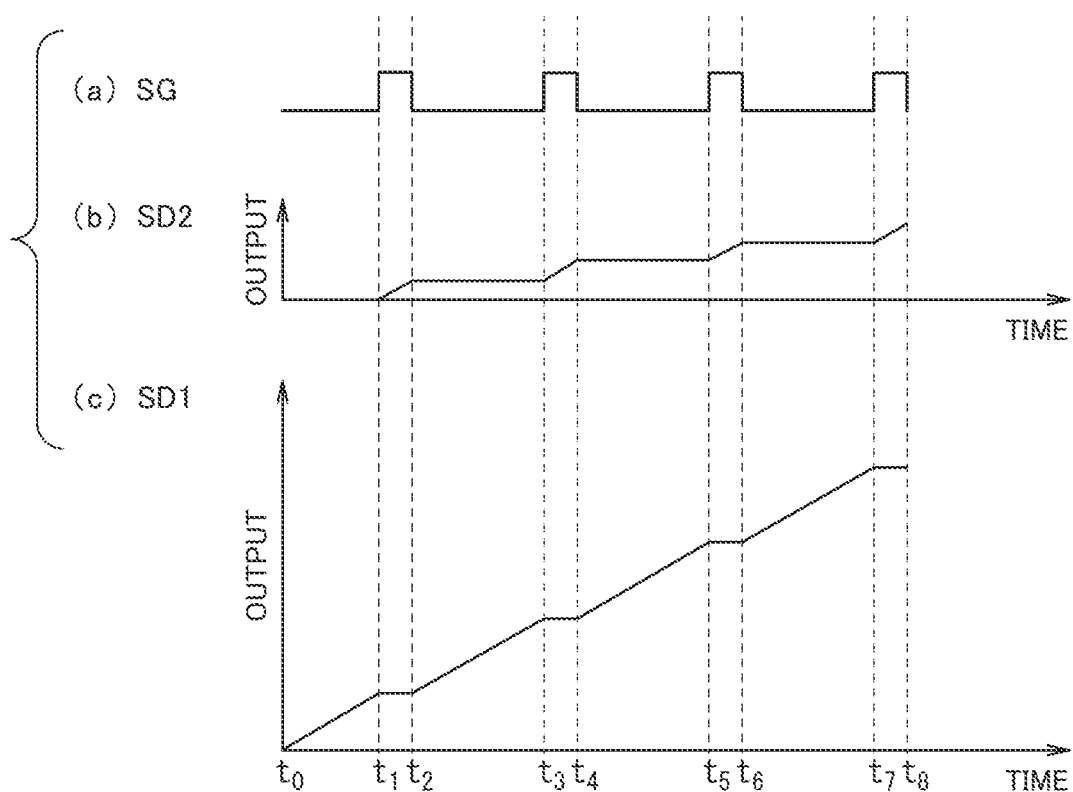
FIG. 15 (a) is a view illustrating a waveform of a signal-charge drive-pulse which is applied to the select-gate electrode of the photoelectric conversion element pertaining to the second embodiment, and FIG. 15 (b) is a timing chart of an output from the first charge-accumulation region in the photoelectric conversion element pertaining to the second embodiment, explaining a relationship with FIG. 15 (a), and FIG. 15 (c) is a timing chart of an output from the second charge-accumulation region of the photoelectric conversion element pertaining to the second embodiment to explain the relationship with FIG. 15 (a).

Next, one example of the charge transferring operation in the solid-state image sensor pertaining to the second embodiment of the present invention is explained by referring to the timing charts illustrated in FIGS. 15 (a) to 15 (c). Each abscissa in FIGS. 15 (a) to 15 (c) indicates respective times in one frame period. The ordinate in FIG. 15 (a) indicates a change in a voltage of the signal-charge drive-pulse SG applied to the select-gate electrode 14 on the second route-select unit, the ordinate in FIG. 15 (b) indicates accumulated charge amounts of the first signal charges accumulated in the first charge-accumulation region SD1, and the ordinate in FIG. 15 (c) indicates accumulated charge amounts of the second signal charges accumulated in the second charge-accumulation region SD2.

In a period between times t0 and t1, as illustrated in FIG. 15 (a), when the select-gate electrode 14 on the second route-select unit is turned off by a signal-charge drive-pulse SG, the signal-charge drive-pulse SG suppresses the second signal charges from being transferred to the second charge-accumulation region SD2. As illustrated in FIG. 15 (b), the second signal charges accumulated in the second charge-accumulation region SD2 are constant. On the other hand, the signal-charge drive-pulse SG allows the first signal charges to be transferred to the first charge-accumulation region SD1 on the first route-select unit. Thus, as illustrated in FIG. 15 (c), the first signal charges are accumulated in the first charge-accumulation region SD1.

In a period between times t1 and t2 that is shorter in time than the period between the times t0 and t1, as illustrated in FIG. 5 (a), when the select-gate electrode 14 on the second route-select unit is turned on by the signal-charge drive-pulse SG, the second signal charges are transferred to the second charge-accumulation region SD2, and as illustrated in FIG. 15 (b), the second signal charges are accumulated in the second charge-accumulation region SD2. On the other hand, the signal-charge drive-pulse SG suppresses the first signal charges from being transferred to the first charge-accumulation region SD1 on the first route-select unit, and as illustrated in FIG. 15 (c), the first signal charges accumulated in the first charge-accumulation region SD1 are constant.

That is, the first signal charges are accumulated in the first charge-accumulation region SD1 by a long-time exposure between the times t0 and t1, and the second signal charges are accumulated in the second charge-accumulation region SD2 by a short-time exposure between the times t1 and t2. The complementary combination of the long-time exposure and the short-time exposure is repeated in a period between times t2 and t3, a period between times t3 and t4, a period between times t4 and t5, a period between times t5 and t6, a period between times t6 and t7 and a period between times t7 and t8, alternately and cyclically, within the one frame. In addition, FIGS. 15 (a) to 15 (c) exemplify an operation for repeating the complementary combination of the long-time exposure and the short-time exposure quadruple times. However, the complementary combination of the long-time exposure and the short-time exposure may be repeated at least twice, may be repeated triple times and may be repeated more than quintuple times. Also, as will be described later as a photoelectric conversion element pertaining to a first modification of the second embodiment, in situation that motion-distortion is not problematic when the operation of a target is slow, a mode of a single repetition within the one frame is allowable.

At the time t8 at which the one frame finishes, the first signal charges accumulated in the first charge-accumulation region SD1 and the second signal charges accumulated in the second charge-accumulation region SD2 are read out in accordance with the time sequence. That is, the driving method pertaining to the second embodiment of the present invention is a scheme that repeats the long-time exposure period L and the short-time exposure period S, which are illustrated in FIG. 7 (d), multiple times in one frame period.

Pertaining to the second embodiment of the present invention, by using the first charge-accumulation region SD1 and the second charge-accumulation region SD2 and repeatedly accumulating and reading out the first signal charges and the second signal charges which have two sensitivity curves that differ from each other, it is possible to achieve both of super high sensitivity and wide dynamic range, and it is further possible to obtain an image in which the motion-distortion of a synthesized image is small even for a photographic target whose motion is large. Thus, the solid-state image sensor pertaining to the second embodiment is suitable for an apparatus used for a case in which motion of the imaging target is high speed, and the illumination intensity changes sharply and greatly, such as a situation under a headlight of a vehicle, a monitoring camera or the like.

Moreover, among the first charge-accumulation region SD1 and the second charge-accumulation region SD2, one of the charge-accumulation regions, or the first charge-accumulation region SD1 side is set to be a virtual select-gate electrode, and by using a single select-gate electrode 14, it is possible to sort the first and second signal charges to the first charge-accumulation region SD1 and the second charge-accumulation region SD2, respectively. Thus, it is possible to simplify the structure of a photoelectric conversion element, which is used as a pixel, and the pattern of surface interconnections for drive-signal lines when a plurality of pixels is arrayed. Hence, it is possible to provide a solid-state image sensor of higher integration density.

First Modification of Second Embodiment

In the second embodiment of the present invention, we have exemplified the case of using the driving method that repeats multiple times of the long-time exposure period L and the short-time exposure period S, as illustrated in FIG. 7 (*d*). However, the photoelectric conversion element and solid-state image sensor pertaining to the second embodiment of the present invention can be applied to a conventional driving method. That is, as illustrated in FIG. 7 (*b*), it is allowable to perform the dual sampling that repeats the long-time exposure period L in which the select-gate electrode 14 is turned on and the short-time exposure period S in which the select-gate electrode 14 is turned off, for each frame. Moreover, as illustrated in FIG. 7 (*c*), it is allowable to use a read-out method that divides one frame into the long-time exposure period L, the short-time exposure period S1 and the super short-time exposure period S2, by controlling the select-gate electrode 14.

Second Modification of Second Embodiment

Figure 16:
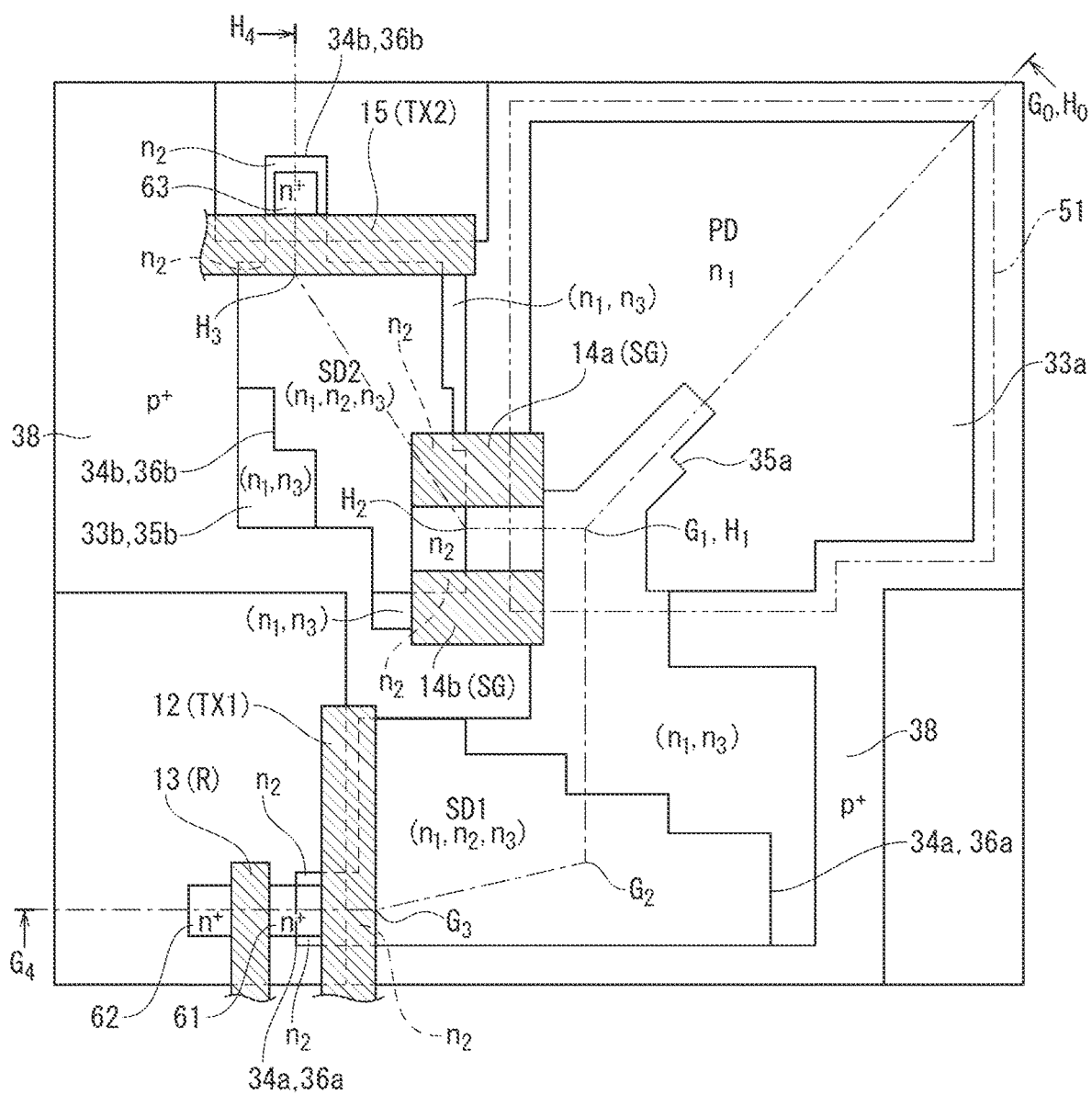
FIG. 16 is a schematic plan view (top view) that illustrates an outline of a photoelectric conversion element pertaining to a modification of the second embodiment of the present invention.

A photoelectric conversion element pertaining to the second modification of the second embodiment of the present invention differs from the photoelectric conversion element pertaining to the second embodiment, in that the second modification of the second embodiment encompasses a second route-select unit, or a pair of field-control electrodes (14*a* and 14*b*), as illustrated in FIG. 16, instead of the select-gate electrode 14 explained in the photoelectric conversion element pertaining to the second embodiment illustrated in FIG. 9.

As can be understood from FIG. 16, a field-control electrode, or the gate electrode is not arranged directly above a charge-transfer route, or the channel through which the second signal charges of the second route-select unit (14*a* and 14*b*) move. That is, the channel does not exist immediately under the gate electrodes that implement the insulated-gate structures of the second route-select unit (14*a* and 14*b*). The channel is not disposed immediately under the second route-select unit (14*a* and 14*b*), and the channel is buried in the charge-transfer route (charge transferring direction) that is defined between a pair of field-control electrodes. In the foregoing configuration, the potential and electric field of the charge-transfer route, or the channel are controlled by static induction effect due to electric lines of force, which extend in a lateral direction orthogonal to the charge-transfer route, for each of the charge-transfer routes in the second route-select unit (14*a* and 14*b*).

The second route-select unit (14*a* and 14*b*) is not arranged directly above the charge-transfer route. Thus, immediately under the gate electrode such as the gate structure of the conventional MOS transistor, surface potential is not controlled in a vertical direction, or the depth direction. In the photoelectric conversion element pertaining to the second modification of the second embodiment illustrated in FIG. 16, the potentials of the charge-transfer routes are controlled, respectively, by the static induction effect exerted by the electric lines of force, which extend in accordance with the Gauss's law in each lateral direction, in the second route-select unit (14*a* and 14*b*). By using the static induction effect due to the lateral electric field, it is possible to achieve the photoelectric conversion element for transferring the second signal charges, in such a way that the electric field is held substantially constant over a long distance in a charge-transfer direction.

In the photoelectric conversion element pertaining to the second modification of the second embodiment illustrated in FIG. 16, contrary to the photoelectric conversion element pertaining to the second embodiment illustrated in FIG. 9, the select-gate electrode that implements the usual insulated-gate structure is not arranged on the first route-select unit. However, double-route selection-mechanism is implemented by, in such a way that the route-selection mechanism which uses a lateral electric field is included as the second route-select unit (14*a* and 14*b*). Similar to the explanation in the second embodiment, when the second route-select unit (14*a* and 14*b*) is turned on by the lateral electric field, the first route-select unit is turned off. When the second route-select unit (14*a* and 14*b*) is turned off by the lateral electric field, the first route-select unit is turned on.

For this reason, similarly to the illustration in the timing chart in FIG. 15, by applying the driving electric field only to the second route-select unit (14*a* and 14*b*), it is possible to sort and transfer the first signal charges to the first charge-accumulation region SD1 and the second signal charges to the second charge-accumulation region SD2, selectively, multiple times in a single frame. At that time, the photoelectric conversion element pertaining to the second modification of the second embodiment can temporally divide one frame, can repeat the long-time exposure period L and the short-time exposure period S alternately and complimentary with multiple times, and can selectively accumulate the first signal charges and the second signal charges in the first charge-accumulation region SD1 and the second charge-accumulation region SD2, respectively and repeatedly with multiple times in one frame period, and read out them. Thus, by using the photoelectric conversion element pertaining to the second modification of the second embodiment illustrated in FIG. 16, the effectiveness similar to the structure illustrated in FIG. 13, and the like, in which it is possible to obtain the images having a wide dynamic range and a small motion-distortion with respect to a high-speed moving target, can be achieved in simple structure.

Other Embodiment

As mentioned above, the present invention has been described in accordance with the first and second embodiments. However, the discussions and drawings that implement a part of the disclosure of the first and second embodiments should not be understood to limit the scope of the present invention. From the disclosure of the first and second embodiments, various modifications, examples and operational techniques would be evident for one skilled in the art.

In the explanations of the first and second embodiments, the first conductivity type is explained as the p-type, and the second conductivity type is explained as the n-type. However, even if the first conductivity type is explained as the n-type and the second conductivity type is explained as the p-type, it may be possible to easily understand that the similar effectiveness can be obtained, when the electrical polarity is set opposite to each other. In addition, in the explanations of the first and second embodiments, the first and second signal charges on which the processes, such as transfer, storage and the like, are performed are defined as to the electrons, and in the potential profiles, the downward direction (depth direction) on the drawing is defined as the positive direction of the potential. However, in a case that the electrical polarity is set opposite to each other, the charges on which the processes are performed become the holes. Thus, the potential shape, which indicates a potential barrier, a potential valley, a potential well or the like within the photoelectric conversion element, is represented such that the downward direction (depth direction) on the drawing is represented as the negative direction of the potential.

Also, a semiconductor material that implements the charge-transfer route and the like in the present invention is not limited to silicon (Si). In particular, in a case of a compound semiconductor, the interface defects and interface states at an interface between the surface of the compound semiconductor and the gate insulating film 11 become problematic. Thus, the structure of the route-selection mechanism that does not use the gate insulating film, as explained in the second embodiment of the present invention, can avoid the influence ascribable to the interface defects and the interface states. Thus, the structure of the route-selection mechanism explained in the second embodiment is effective for the photoelectric conversion element and the solid-state image sensor each of which uses the various compound semiconductors, such as III-V group compound semiconductor, II-VI group compound semiconductor and the like. Hence, the structures and technical ideas of the photoelectric conversion element and solid-state image sensors, which are explained as the examples in the first and second embodiments, become the important technologies for the compound semiconductors.

In this way, it is natural that the present invention includes various embodiments and the like that are not described here. Thus, the technical scope of the present invention is determined only by the matters specifying the invention that are prescribed by the reasonable claims from the above explanations.

REFERENCE SIGNS LIST

11 a gate insulating film
12, 15 a transfer-gate electrode
13 a reset-gate electrode
14, 16 a select-gate electrode
31 a semiconductor substrate
32 a principal layer
33a a surface-buried region (a light-receiving cathode-region)
33b, 33c a potential-gradient generation-region
34a, 34b a well region
35a a guide region
35b, 35c an outer-guide region
36a, 36b a buried-accumulation region
38 a pinning layer
51 a light-shielding plate
61, 63 a charge read-out region
62 a reset-drain region
71 a voltage read-out buffer-amplifier
104 a timing generator
106 a horizontal shift register
107 a noise cancelling circuit
108 a signal processor
109 a differential amplifier
$B_j$ a vertical signal line
$C_1$ an input capacitance
$C_2$ an integral capacitance
$MS_i$ a switching-transistor
$CDS_1$ to $CDS_m$ a correlated double sampling circuit
$ADC_1$ to $ADC_m$ an A-D converter
PD a photodiode
SD1, SD2 a charge-accumulation region (a charge-accumulation diode)
$X_{ij}$ a pixel

The invention claimed is:

1. A photoelectric conversion element, comprising:
   a principal layer of a first conductivity type;
   a surface-buried region of a second conductivity type, which is selectively buried in an upper portion of the principal layer and implements a photodiode with the principal layer;
   a first charge-accumulation region of the second conductivity type, buried in vicinity of the surface-buried region in the upper portion of the principal layer, configured to accumulate first signal charges transferred from the surface-buried region, the first signal charges are generated by the photodiode;
   a second charge-accumulation region of the second conductivity type, buried in the principal layer apart from the first charge-accumulation region, configured to accumulate second signal charges transferred from the surface-buried region, the second signal charges are generated by the photodiode;
   a guide region of the second conductivity type, which is buried in a part of the upper portion in the surface-buried region, having a common region with a branched structure for guiding the first signal charges from a common charge-transfer route implemented by the common region to the first charge-accumulation region and guiding the second signal charges through the common charge-transfer route to the second charge-accumulation region, and having a higher impurity concentration than the surface-buried region;
   a first route-select unit, buried in a part of a first charge-transfer route defined between the surface-buried region and the first charge-accumulation region along one branch in the guide region, configured to control the first signal charges from being transferred from the surface-buried region to the first charge-accumulation region; and
   a second route-select unit, buried in a part of a second charge-transfer route defined between the surface buried region and the second charge-accumulation region along the other branch in the guide region, configured to control the second signal charges from being transferred from the surface buried region to the second charge-accumulation region,
   wherein a process including a first period, in which the first signal charges are transferred from the surface-buried region to the first charge-accumulation region, and a second period, in which the second signal charges are transferred from the surface-buried region to the second charge-accumulation region, the second period is shorter than the first period, is repeated multiple times in one frame period.

2. The photoelectric conversion element of the claim 1, wherein the first route-select unit has an insulated-gate structure, and by applying a voltage to a gate electrode of the insulated-gate structure, movement of the first signal charges to be transferred through the charge-transfer route buried in the first route-select unit is controlled.

3. The photoelectric conversion element of the claim 1, wherein the second route-select unit has an insulated-gate structure, and by applying a a voltage to a gate of the insulated-gate structure, movement of the second signal charges to be transferred through the charge-transfer route buried in the second route-select unit is controlled.

4. The photoelectric conversion element of the claim 3, wherein a change in a depletion potential in the charge-transfer route buried in the first route-select unit is induced by the voltage applied to the gate electrode buried in the second route-select unit, and the movement of the first signal charges to be transferred through the charge-transfer route in the first route-select unit is controlled by the change in the depletion potential.

5. A solid-state image sensor, wherein a plurality of unit pixels is arrayed, each of the unit pixels comprising:
- a principal layer of a first conductivity type;
- a surface-buried region of a second conductivity type, which is selectively buried in an upper portion of the principal layer and implements a photodiode with the principal layer;
- a first charge-accumulation region of the second conductivity type, buried in vicinity of the surface-buried region in the upper portion of the principal layer, configured to accumulate first signal charges transferred from the surface-buried region, the first signal charges are generated by the photodiode; and
- a second charge-accumulation region of the second conductivity type, buried in the principal layer apart from the first charge-accumulation region, configured to accumulate second signal charges transferred from the surface-buried region, the second signal charges are generated by the photodiode,
- a guide region of the second conductivity type, which is buried in a part of the upper portion in the surface-buried region, having a common region with a branched structure for guiding the first signal charges from a common charge-transfer route implemented by the common region to the first charge accumulation region and guiding the second signal charges through the common charge-transfer route to the second charge-accumulation region, and having a higher impurity concentration than the surface-buried region;
- a first route-select unit, buried in a part of a first charge-transfer route defined between the surface-buried region and the first charge-accumulation region along one branch in the guide region, configured to control the first signal charges from being transferred from the surface-buried region to the first charge-accumulation region; and
- a second route-select unit, buried in a part of a second charge-transfer route defined between the surface buried region and the second charge-accumulation region along the other branch in the guide region, configured t control the second signal charges from being transferred from the surface-buried region to the second charge-accumulation region,
- wherein in each of the unit pixels, a process including a first period, in which the first signal charges are transferred from the surface-buried region to the first charge-accumulation region, and a second period, in which the second signal charges are transferred from the surface-buried region to the second charge-accumulation region, the second period is shorter than the first period, is repeated multiple times in one frame period.

6. The solid-state image sensor of the claim 5, wherein the first route-select unit has an insulated-gate structure, and by applying a voltage to a gate electrode of the insulated-gate structure, movement of the first signal charges to be transferred through the charge-transfer route buried in the first route-select unit is controlled.

7. The solid-state image sensor of the claim 5, wherein the second route-select unit has an insulated-gate structure, and by applying a voltage to a gate electrode of the insulated-gate structure, movement of the second signal charges to be transferred through the charge-transfer route buried in the second route-select unit is controlled.

8. The solid-state image sensor of the claim 7, wherein a change in a depletion potential of the charge-transfer route buried in the first route-select unit is induced by the voltage applied to the gate electrode buried in the second route-select unit, and the movement of the first signal charges to be transferred through the charge-transfer route in the first route-select unit is controlled by the change in the depletion potential.

* * * * *